US010370773B2

(12) United States Patent
Borse et al.

(10) Patent No.: US 10,370,773 B2
(45) Date of Patent: Aug. 6, 2019

(54) PROCESS FOR MANUFACTURING SYNTHETIC SINGLE CRYSTAL DIAMOND MATERIAL USING A PRESSURE DRIVEN GROWTH PROCESS AND A PLURALITY OF SEED PADS WITH EACH SEED PAD COMPRISING A PLURALITY OF SINGLE CRYSTAL DIAMOND SEEDS

(71) Applicant: Element Six Technologies Limited, Oxfordshire (GB)

(72) Inventors: Dietrich Borse, Hamburg (DE); Eugen Gura, Hamburg (DE); Carlton Nigel Dodge, Oxfordshire (GB); Raymond Anthony Spits, Oxfordshire (GB)

(73) Assignee: Element Six Technologies Limited (GB)

( * ) Notice: Subject to any disclaimer, the term of this patent is extended or adjusted under 35 U.S.C. 154(b) by 0 days.

(21) Appl. No.: 14/383,074

(22) PCT Filed: Mar. 13, 2013

(86) PCT No.: PCT/EP2013/055173
§ 371 (c)(1),
(2) Date: Sep. 4, 2014

(87) PCT Pub. No.: WO2013/135785
PCT Pub. Date: Sep. 19, 2013

(65) Prior Publication Data
US 2015/0027363 A1    Jan. 29, 2015

(30) Foreign Application Priority Data
Mar. 15, 2012  (GB) .................................. 1204533.2

(51) Int. Cl.
C30B 7/10      (2006.01)
C30B 9/00      (2006.01)
(Continued)

(52) U.S. Cl.
CPC ................. *C30B 9/00* (2013.01); *B01J 3/067* (2013.01); *B01J 23/75* (2013.01); *B01J 23/755* (2013.01);
(Continued)

(58) Field of Classification Search
CPC ..... B01J 3/06; B01J 3/065; B01J 3/067; B01J 23/75; B01J 23/755; B01J 23/8892;
(Continued)

(56) References Cited

U.S. PATENT DOCUMENTS 4,547,257 A    10/1985 Iizuka et al.
4,632,817 A *  12/1986 Yazu ....................... B01J 3/062
                                                            117/41

(Continued)

FOREIGN PATENT DOCUMENTS

EP    0322217 A1    6/1989
EP    0332353 A2    9/1989
(Continued)

OTHER PUBLICATIONS

Y. Wang, et al. publication entitled "Crystal growth of diamond from regrowth-treated graphite," Advances in New Diamond Science and Technology, pp. 521 24, MY, Tokyo (1994).*
(Continued)

*Primary Examiner* — Kenneth A Bratland, Jr.
(74) *Attorney, Agent, or Firm* — Armstrong Teasdale LLP

(57) ABSTRACT

A method for manufacturing a plurality of synthetic single crystal diamonds, the method comprising: forming a plurality of seed pads, each seed pad comprising a plurality of single crystal diamond seeds anchored to, or embedded in, an inert holder; loading a carbon source, a metal catalyst, and the plurality of seed pads into a capsule; loading the capsule into a high pressure high temperature (HPHT) press; and subjecting the capsule to a HPHT growth cycle to grow
(Continued)

single crystal diamond material on the plurality of single crystal diamond seeds, the HPHT growth cycle comprising: initiating HPHT growth of single crystal diamond material on the plurality of single crystal diamond seeds by increasing pressure and temperature; maintaining HPHT growth of single crystal diamond material on the plurality of single crystal diamond seeds via a pressure driven growth process by controlling and maintaining pressure and temperature; and terminating HPHT growth of single crystal diamond material on the plurality of single crystal diamond seeds by reducing pressure and temperature, wherein the plurality of single crystal diamond seeds remain anchored to, or embedded in, the inert holders during the HPHT growth cycle.

20 Claims, 4 Drawing Sheets

(51) Int. Cl.
| | | |
|---|---|---|
| *B01J 23/889* | (2006.01) | |
| *B01J 3/06* | (2006.01) | |
| *B01J 23/75* | (2006.01) | |
| *B01J 23/755* | (2006.01) | |
| *C30B 29/04* | (2006.01) | |

(52) U.S. Cl.
CPC ...... *B01J 23/8892* (2013.01); *B01J 2203/068* (2013.01); *B01J 2203/0625* (2013.01); *C30B 29/04* (2013.01)

(58) Field of Classification Search
CPC ......... B01J 2203/0625; B01J 2203/068; C30B 29/00; C30B 29/02; C30B 29/04; C30B 7/00; C30B 7/005; C30B 7/10; C30B 9/00
USPC ... 117/11, 68, 71, 73, 75–79, 200, 204, 911, 117/928–929
See application file for complete search history.

(56) References Cited

U.S. PATENT DOCUMENTS

| | | | | |
|---|---|---|---|---|
| 5,273,730 | A * | 12/1993 | Yoshida | B01J 3/062 117/79 |
| 5,772,757 | A * | 6/1998 | Saito | C23C 16/4401 117/103 |
| 6,627,168 | B1 | 9/2003 | Ohtsubo et al. | |
| 2004/0134415 | A1 * | 7/2004 | D'Evelyn | B01J 3/062 117/84 |
| 2005/0136667 | A1 * | 6/2005 | Sung | B01J 3/062 438/689 |
| 2005/0150444 | A1 * | 7/2005 | Sung | B01J 3/065 117/11 |
| 2006/0016127 | A1 | 1/2006 | Sung | |
| 2010/0028246 | A1 * | 2/2010 | Stromann | B01J 3/062 423/446 |
| 2010/0119790 | A1 * | 5/2010 | Dodge | B01J 3/062 428/212 |
| 2011/0271900 | A1 | 11/2011 | Spits et al. | |

FOREIGN PATENT DOCUMENTS

| | | |
|---|---|---|
| EP | 0528195 A1 | 7/1992 |
| EP | 0 528 195 A1 * | 2/1993 |
| EP | 0528195 B1 | 5/1993 |
| EP | 0737510 A2 | 10/1996 |
| JP | 54-069590 | 6/1979 |
| JP | 59-203717 | 11/1984 |
| JP | S6168395 | 4/1986 |
| JP | 63-084627 | 4/1988 |
| JP | H0523574 | 2/1993 |
| JP | H08141385 | 6/1996 |
| JP | H11207167 | 8/1999 |
| KR | 20110104562 A | 9/2011 |
| WO | 2005/084334 A3 | 9/2005 |
| WO | 2006/129155 A1 | 7/2006 |
| WO | 2008/107860 A2 | 9/2008 |
| WO | 2010/082029 A1 | 7/2010 |
| WO | 2013/135785 A1 | 9/2013 |

OTHER PUBLICATIONS

Y. Wang, et al. publication entitled "Crystal growth of diamond from regrowth-treated graphite," Advances in New Diamond Science and Technology, pp. 521 24, MY, Tokyo (1994). (Year: 1994).*
International Search Report for GB1204533.2 dated Jul. 13, 2012.
International Search Report for GB1304510.9 dated Jul. 31, 2013.
International Search Report for PCT/EP2013/055173 dated Jun. 12, 2013.
Wakatsuki et al., "Suppression of spontaneous nucleation and seeded growth of diamond", High Pressure Research in Mineral Physics, pp. 203-207, 1987.
Wang, et al., "The stability of the regrowth-treated carbon source in the excess pressure method of growing diamonds", High Pressure Science and Technology, Proceedings of the Joint 15th AIRAPT and 33rd EHPRG International Conference, Warsaw, Poland, Sep. 11-15, 1996.
Jia, et al., "Cobalt and manganese as impurities in synthetic diamonds", High Pressure Science and Technology (edited by W. A. Trzeciakowski, World Scientific, 1996) 565-567.
Wakatusuki, "Formation and Growth of Diamond for understanding a better control of the process", Rev. High Pressure Sci. Technology, vol. 7, 31, pp. 956-956 Dec. 1998.
Wang et al., "Crystal growth of diamond from regrowth-treated graphite", Advance in New Diamond Science and Technology, 521-524, MY, Tokyo, 1994.

* cited by examiner

PROCESS FOR MANUFACTURING SYNTHETIC SINGLE CRYSTAL DIAMOND MATERIAL USING A PRESSURE DRIVEN GROWTH PROCESS AND A PLURALITY OF SEED PADS WITH EACH SEED PAD COMPRISING A PLURALITY OF SINGLE CRYSTAL DIAMOND SEEDS

CROSS-REFERENCE TO RELATED APPLICATIONS

This application is the U.S. national stage entry under 35 U.S.C. § 371 of PCT/EP2013/055173 filed on Mar. 13, 2013 which claims priority to GB 1204533.2 filed on Mar. 15, 2012, both of which are incorporated by reference in their entirety for all purposes.

FIELD OF INVENTION

Certain embodiments of the present invention relate to a process for high pressure high temperature (HPHT) synthesis of a plurality of large single crystal diamonds.

BACKGROUND OF INVENTION

HPHT synthesis of single crystal diamond material is well known in the art. Standard processes for manufacturing small crystals of diamond, i.e. diamond grit, involve mixing a graphite powder with a powdered metal catalyst comprising, for example, cobalt and iron (advantageously in a ratio at, or close to, the eutectic composition—65% Co:35% Fe). Other catalyst compositions are also known comprising, for example, Co, Fe, Ni, and/or Mn. A micron scale diamond powder may also be included in the reaction mixture to form seeds for diamond growth although spontaneous nucleation is possible.

In the aforementioned diamond grit synthesis process, the reaction mixture is transferred into a capsule and loaded into a press where it is subjected to a pressure of approximately 5.5 GPa and a temperature of approximately 1720 Kelvin. Such pressures and temperatures are in the region of the carbon phase diagram where diamond is the thermodynamically stable form of carbon and diamond growth occurs to form a large number of small diamond grit particles. Larger rogue crystals can form within the capsule but these are mostly highly twinned crystals with undesirable aspect ratios.

Typically, in the diamond grit synthesis process approximately constant pressure and temperature conditions are applied during diamond growth. Diamond growth to form grit particles suitable for abrasive applications may occur over a time period of a few minutes to several hours depending on the size of diamond grit particles desired for a particular application. Typical growth runs may be less than 1 hour, e.g. between 15 and 30 minutes. Typical reaction mixtures comprise approximately 50% by weight of carbon (graphite) and approximately 50% by weight of metal catalyst. As previously stated, fine diamond seeds may also be mixed with the reaction mixture to form a large number of nucleation sites within the reaction volume.

Diamond grit particles suitable for abrasive applications may range in size from, for example, 1 μm to 1 mm and the growth conditions and growth time can be controlled to produce a particular target size. Although the size of crystals coming from a single growth run will vary somewhat, the process can be controlled to obtained a reasonably uniform grit product. Subsequent processing can be utilized to separate the diamond particles according to size, weight, and/or quality.

A diamond grit process which uses small diamond seeds dispersed in a graphite powder matrix to form nucleation sites can be advantageous in producing a more controlled process yielding more consistent and uniform product when compared to a process which relies upon spontaneous nucleation within a graphite matrix. Such a seeded process works on the premise that the pressure required to grow diamond seeds is less than that required for spontaneous nucleation. Spontaneous nucleation can be undesirable as it can lead to formation of a large number of very small diamond crystals rather than larger grit particles. If a pressure $P_1$ is the pressure required to grow on seeds and a pressure $P_2$ is the pressure required to cause spontaneous nucleation, then it is required to operate at a pressure $P_3$ which lies in between pressures $P_1$ and $P_2$. The amount that pressure $P_3$ exceeds $P_1$ is known as the over-pressure. This over-pressure may be controlled so as to fall within a pressure window in which diamond seed growth occurs but where widespread spontaneous nucleation is avoided, i.e. $P_3$ is maintained between $P_1$ and $P_2$. As diamond growth on the seeds is driven by this over-pressure, the process is described as being pressure-driven.

During the growth process, the metal catalyst melts and the carbon dissolves in the metal catalyst and precipitates on the seeds. The metal catalyst functions as a solvent for carbon material and so is often referred to as metal solvent rather than metal catalyst. Carbon transport is via diffusion through the metal solvent. Variations in the graphite can result in nucleation sites and some spontaneous nucleation occurs away from the diamond seeds. This can be reduced by selecting good quality ordered flakes of graphite rather than disordered graphite powder.

Seeds are numerous and distributed throughout the capsule. Accordingly, carbon transport distances to individual seeds are relatively small. Regions located around the seeds become depleted in carbon as the carbon is taken out of solution during seed growth. More carbon is pulled into solution and diffuses through the depleted region. The concentration gradient in combination with the over-pressure aids in pushing the flow of carbon from the solid graphite state into solution, through the metal solvent in the depleted region, and out of solution into the solid diamond state on the seeds.

The volume of the capsule decreases during diamond growth as graphite is converted to diamond. This volume drop may be relatively large if a large quantity of carbon is converted to diamond. As reaction times are relatively short in the grit process, the rate of volume drop can be relatively high.

As diamond seeds are not anchored and are free to move around within the reaction volume, the growing seeds will tend to rise in the reaction volume under buoyancy forces from the liquid metal solvent. This can lead to inconsistent diamond crystal size and morphology. However, movement of the growing seeds under buoyancy forces can be inhibited by the presence of a graphite matrix which effectively confines the diamond particles, at least over the relatively short growth time periods required for the diamond grit process. As such, a high graphite content forming a restrictive graphite matrix coupled with well controlled and uniform pressure and temperature conditions and relatively short reaction times can give reasonably consistent crystal morphology and size for diamond grit product.

Variations of the aforementioned diamond grit process are known. For example, the small diamond seeds may be coated as described for example in WO2006/129155. Furthermore, rather than randomly distributing the small diamond seeds throughout the reaction volume the seeds may be more uniformly distributed. For example, U.S. Pat. No. 4,547,257 describes a process comprising alternating plates of graphite and metal catalyst, providing an array of holes in either the graphite or metal catalyst plates, and disposing small micron scale diamond seeds in the array of holes to form a more uniform distribution of seeds for HPHT diamond growth. EP0737510 describes the use of coated diamond seeds which may be disposed in a layered arrangement. For example, small micron scale diamond seeds may be coated with a mixture of graphite and metal catalyst, formed into compacted layers, and loaded into a HPHT capsule in a layered arrangement comprising layers of coated seeds, layers of metal solvent, and layers of graphite material. EP0528195 also discloses a HPHT capsule configuration comprising a stacked layer structure including layers of metal catalyst, layers of graphite, and layers of small micron scale diamond seed crystals. In this case, the micron scale diamond seed crystals are disposed between layers of metal catalyst. U.S. Pat. No. 6,627,168 discloses a similar stacked layer structure in which small micron scale diamond seed crystals are pressed into the surface of either a graphite layer or a metal catalyst layer. An adhesive sheet is used to transfer the seed crystals onto the graphite layer or metal catalyst layer. WO2005/084334 also discloses a stacked layer configuration in which layers of small micron scale diamond seeds are embedded in metal catalyst layers, graphite layers, or in layers comprising a mixture of metal catalyst and graphite. The seeds are transferred into the layers using one or more of the following methods: a template comprising apertures corresponding to seed positions; a transfer sheet which may be a metal catalyst layer or an adhesive layer; or a vacuum chuck. It is described that templates can be removed and reused after transfer of the seeds. If an adhesive transfer sheet is used it is described that this may be left in place within the capsule and decomposes during the initial stages of HPHT processing. Alternatively, a metal catalyst layer can be used as a transfer sheet such that the transfer sheet melts during HPHT processing.

While the aforementioned process is successful for manufacturing small diamond grit particles, the process is not suitable for manufacturing larger (>1 mm) single crystal diamonds with an acceptable morphology. Growth of larger single crystal diamonds requires fewer seeds per mass of carbon source material such that a larger quantity of carbon is available for transport to each seed. Furthermore, longer reaction times are required to grow larger crystals and carbon transport distances are increased. If the grit process is run with fewer seeds for longer time periods, as the graphite becomes depleted the growing diamond seeds become more mobile within the reaction volume, being less restricted by the graphite matrix, and the seeds move upwards under buoyancy forces within the liquid metal solvent. As the orientation of the seeds varies which respect to the applied pressure, and/or the distance between the seeds and the graphite material is variable and ill-controlled, the seeds tend to grow with ill-defined morphologies if the process is run for the longer time periods required to fabricate large single crystal diamonds. Furthermore, it has been found to be difficult to control the applied pressure over long periods of time using this process such that an overpressure is maintained for seed growth without exceeding the pressure limit at which widespread spontaneous nucleation occurs. That is, the previously described pressure window for this process between $P_1$ (the pressure at which diamond seed growth occurs) and $P_2$ (the pressure at which widespread spontaneous nucleation occurs) is relatively narrow and it is difficult to maintain an operating pressure $P_3$ so as to be maintained within this operating pressure window over the long periods of time required for large single crystal diamond growth.

In light of the above, an alternative method is utilized in the art for growth of larger single crystal diamonds. The standard method for manufacturing larger single crystal HPHT diamond material is known in the art as the temperature gradient method. This method is similar to the previously described diamond grit process in that the reaction mixture comprises a graphite powder (graphite flakes or a diamond grit could alternatively be used) and a metal catalyst. However, instead of using a micron scale diamond powder to seed the reaction mixture, a seed pad is manufactured comprising a one or more single crystal diamond seeds anchored to, or embedded in, an inert holder which may be formed by a ceramic disk. The seeds themselves are larger in size than the micron size diamond powder used to seed grit processes, typically 0.5 mm or greater, and are selected to have a desired morphology and orientation. The seed pad, which is prepared from a chemically inert ceramic material such as MgO, is introduced into a capsule and the reaction mixture is disposed over the seed pad within the capsule. The capsule is then loaded into a press and subjected to a HPHT treatment.

The temperature gradient method is further distinguished over the diamond grit process in that while a relatively constant pressure is maintained over at least a majority of a growth run, the capsule is heated to a higher temperature at the top of the capsule than at the bottom of the capsule. Thus a temperature gradient is formed across the capsule from top to bottom and it is this temperature gradient which drives carbon transport and diamond seed growth. Hence this process being known as the temperature gradient method.

The temperature gradient method differs further from the previously described pressure driven grit process in the chemistry of the reaction mixture. Typically, much less carbon is provided in the reaction mixture which may comprise approximately 10% by weight of carbon (graphite) and approximately 90% by weight of metal solvent. Furthermore, the metal solvent may differ according to certain processes although similar compositions to those used for the grit process may be utilized including, for example, cobalt-iron eutectic compositions or other compositions comprising, for example, Co, Fe, Ni, and/or Mn.

The capsule configuration for the temperature gradient method also differs from that used in the grit process in that a single seed pad is located in a lower region of the capsule in a horizontal orientation. The reaction mixture is located over this seed pad. In practice, one or more layers of metal catalyst strips may be provided over the seeds forming a layer a few millimeters thick with the remaining reactants disposed thereover as a mixture. The carbon composition of the metal strips is reduced when compared to the carbon content in the overlying mixture, e.g. a precisely controlled carbon content of a few percent by weight. The reason for this arrangement is to reduce the carbon concentration in contact with the seeds at the start of the run as this prevents adverse effects taking place when the carbon is transformed to diamond. The capsule design is such as to give uniform radial temperature distribution. This is achieved through design of heating elements and insulating materials.

The temperature gradient method may be defined as comprising two main stages. In a first stage graphite is converted to fine diamond crystals by application of pressure and temperature to dissolve graphite in the metal solvent and crystallize diamond by spontaneous nucleation. As an alternative, fine diamond crystals may be provided as a source of carbon from the outset.

The fine diamond crystals are buoyant in the metal solvent and rise to an upper region of the capsule thus forming a three layer system: a top layer of fine diamond crystals; an intermediate layer primarily comprising carbon saturated metal solvent; and a lower portion comprising the seed pad.

In a second stage of the temperature gradient process diamond seed growth occurs. A high temperature in the upper region of the capsule causes diamond crystals to dissolve. The equilibrium concentration of carbon is higher at the hotter end of the capsule than at the cooler end. Dissolved carbon diffuses downwards and a lower temperature at the seed pad causes carbon to come out of solution at the seeds resulting in diamond growth on the seeds. While there is a relatively large volume drop during the first stage as graphite material is converted to diamond material via spontaneous nucleation to form a diamond material as the carbon source for seed growth, the reaction volume remains fairly stable during the second stage of diamond seed growth as the reaction involves diamond-to-diamond conversion.

While not being bound by theory, it is believed that although carbon transport may be partially driven by a carbon concentration gradient between upper and lower regions of the capsule, this mechanism cannot wholly account for the levels of carbon transport observed in the temperature gradient method. Secondary ion mass spectrometry (SIMS) analysis indicates that the concentration gradient of carbon is very small along most of the capsule. Accordingly, it would appear that Fick's diffusion alone (dC/dx) cannot explain the rate of carbon transport. As such, it is believed that the temperature dependent Soret diffusion term (dT/dx) is dominant over the length of the capsule. Soret diffusion (dT/dx) thus drives the process such that the rate of carbon transport to the seeds is increased as the temperature gradient is increased. Time modelling of this process indicates that observed rates of carbon transport over the length of the capsule can only be accounted for using this mechanism. In contrast, in the local vicinity of a seed, a region of carbon depleted material forms, sometimes known as a "carbon depletion zone" or "carbon denuded zone", which can to some extent limit seed growth rate. It is believed that the larger carbon concentration gradient in the immediate vicinity of the seed crystals is dominated by Fick's diffusion although this diffusion constant cannot sustain carbon transport by concentration gradient alone.

Seed growth is thus driven by the temperature differential and the length scale driving dissolution of carbon (diamond) at the top region of the capsule and precipitation of carbon onto the seed in the lower region of the capsule. Furthermore, it is believed that carbon transport is largely diffusion based rather than convection based although some temperature driven convention currents may occur (although these will be limited because the hotter material is at the top of the capsule from the outset). It is also worth noting that diamond growth doesn't occur at the seed crystals if the temperature gradient is reversed, i.e. hotter at the bottom of the capsule, and that the temperature gradient is always aligned with the direction of gravity. This is important as undesirable spontaneously nucleated diamond that forms in the catalyst between the diamond source and the seed crystals will tend to migrate through buoyancy back to the top of the capsule (i.e. where the carbon source material is located). Furthermore, attempts to grow in a radial direction have been largely unsuccessful for similar reasons.

An important feature of the temperature gradient process is that the seeds are anchored to a pad in a lower portion of the HPHT capsule to ensure that the seeds have a fixed and well defined orientation relative to the applied temperature and pressure. That is, the growing diamond crystals are prevented from floating within the metal solvent during synthesis and this allows the crystals to grow with a well defined single crystal morphology. If the seeds are allowed to float in the melted reactants during synthesis, this leads to misshapen growth. Furthermore, buoyancy would otherwise drive the seeds to the top end of the capsule i.e. to where the carbon source material is located. Therefore anchoring is required to form good morphology, large single crystal diamond material. The temperature gradient allows carbon to be transported to the anchored crystals to achieve large single crystal diamond growth. Diamond growth is driven by the temperature differential. A larger temperature gradient will, to first order, increase the growth rate of diamond.

Another important feature of the temperature gradient process is that all the seeds must be placed at the same level in the temperature gradient so as to be exposed to the same growth conditions and thus obtain uniform product. That is, a single seed pad is provided and located at a position within the temperature gradient such that all the seeds on the pad are exposed to substantially the same temperature. Additionally, seed spacing is important as non-uniformly spaced seeds can also result in non-uniform growth rates.

FIG. 1 illustrates a capsule arrangement in a HPHT press for a temperature gradient process. The HPHT press comprises anvils 2. A capsule 4 is loaded within the HPHT press. The capsule 4 includes a seed pad 6 on which diamond seeds 8 are disposed. Reactants 10 including a carbon source material and a metal catalyst are disposed over the seed pad. A temperature difference between the top and bottom sides of the capsule ($T_2 > T_1$) is generated and maintained to drive growth. The temperature gradient method is capable of forming a plurality of relatively large single crystal diamonds in a single process run. However, the number of single crystal diamonds is limited to the number which can be mounted to the seed pad and/or the size of crystal that is ultimately required. The temperature gradient may be matched to the seed size and distribution. In this regard, it may be noted that there is an inter-play between the number of seeds, the magnitude of the temperature gradient, and the tendency to form inclusions. For example, if metal inclusions within the diamond material grown on the seeds are to be avoided it is known that the temperature gradient must be reduced as the number of seeds per unit area on the seed pad is reduced.

It should be appreciated that both the diamond grit process and the temperature gradient process have been the subject of many years of research by numerous groups and that both processes have been carefully optimized for their respective purposes, i.e. large quantities of diamond grit material for abrasive applications and lower quantities of large synthetic single crystal diamonds for a range of applications including optical, thermal and mechanical applications. As such, the aforementioned description of these processes is only intended to provide an over-view in order to set the context for the present invention.

Modifications to the temperature gradient method have been proposed for increasing the number of large single crystal diamonds which can be formed per HPHT process run. For example, a multi-layer temperature gradient method may be envisaged by stacking a plurality of seed pads into a single HPHT capsule with carbon/metal solvent powder disposed between each of the layers. However, this approach is considered to be problematic as the absolute temperature at the seed pads will be different for each layer therefore resulting in different growth morphologies. Since the temperature window for optimum growth is small, this is likely to result in poor growth or perhaps no growth at all. The metal solvent composition could potentially be varied such that the eutectic temperature is adjusted to compensate this problem. However, such arrangements are not considered particularly successful.

Another alternative way which may be envisaged to solve the problem of providing multiple seeds pads in a temperature gradient method is to provide a more complex heating arrangement in which separate heating elements are applied to the layered structure in order to try and provide uniform growth conditions at each of the seeds pads and effectively provide a plurality of zones, each having their own temperature gradient. However, it is difficult to vary the temperature in this fashion in any practical arrangement due partly to the relatively high aspect ratio of the seed pads and solvent catalyst. Accordingly, while this is conceptually possible, in practice it is difficult to configure and control such a system to ensure that each seed grows in a uniform manner.

In contrast to the temperature gradient seed-pad processes described above, a pressure driven seed-pad configuration has previously been proposed in the art by Masao Wakatsuki and co-workers at the Institute of Materials Science, University of Tsukuba who have published several academic papers and patent applications in this area including: (1) Masao Wakatsuki "Formation and Growth of Diamond—For Understanding and Better Control of The Process" Rev. High Pressure Sci. Technol., Vol. 7 (1998) 951-956; (2) JP 63-084627; (3) Masao Wakatsuki and Kaoru Takano "Suppression of spontaneous nucleation and seeded growth of diamond", High-Pressure Research in Mineral Physics, pp 203-207 (1987); (4) Y. Wang, R. Takanabe and M. Wakatsuki, "The stability of the regrowth-treated carbon source in the excess pressure method of growing diamonds", High Pressure Science and Technology, Proceedings of the Joint 15$^{th}$ AIRAPT and 33$^{rd}$ EHPRG International Conference, Warsaw, Poland, Sep. 11-15, 1996, ed. By W. A. Trzeciakowski, World Scientific Publ. Co., London, 1996 pp. 565-567; (5) JP59-203717; (6) JP54-069590; and (7) Y. Wang et al. "Crystal growth of diamond from regrowth-treated graphite", Advances in New Diamond Science and Technology, 521-524, MY, Tokyo, 1994.

These prior art documents published in the 1980's and 1990's identify the problem that it is difficult to control a pressure driven process to grow single crystal diamond material on seeds while at the same time avoiding spontaneous nucleation of diamond growth in the graphite matrix. As previously described in relation to the seeded diamond grit process, the pressure $P_1$ required to grow diamond seeds is less than the pressure $P_2$ required for spontaneous nucleation. As such, if controlled seed growth is to be achieved it is required to operate at a pressure $P_3$ which lies in between pressures $P_1$ and $P_2$. However, it is difficult to control the applied pressure over long periods of time using this process such that an over-pressure is maintained for seed growth without exceeding the pressure limit at which widespread spontaneous nucleation occurs. That is, the previously described pressure window between $P_1$ and $P_2$ is relatively narrow and it is difficult to maintain an operating pressure $P_3$ so as to be maintained within this operating pressure window over the long periods of time required for large single crystal diamond growth.

Masao Wakatsuki and co-workers propose a solution to this problem which utilizes a two step process comprising: (i) surface regrowth of graphite at a pressure below that required for diamond growth; and (ii) subsequently increasing the pressure to achieve diamond seed growth at a raised pressure. It is described that in the first step of the method source graphite stays largely unchanged except for being covered with regrown graphite particles over its surface. It is described that the regrown graphite material functions to absorb dissolved graphite, decreasing supersaturation for nucleation or growth of diamond through a kinetic balance between absorption and supply from the raw graphite. It is stated that this mechanism results in a buffer effect on the supersaturation for nucleation or growth of diamond against a change of reaction pressure and thus the rate of nucleation and growth is easily kept stable by the presence of regrown graphite particles, even if the reaction pressure is varied a little.

Masao Wakatsuki and co-workers thus suggest that such a two step process can be used to increase the size of the pressure window between $P_1$ and $P_2$ allowing an operating pressure $P_3$ to be maintained within this pressure window during the second step to achieve controlled growth of diamond seeds in a pressure driven process. Furthermore, they demonstrated such growth in HPHT capsule configurations including two seeds, one located in a lower region of the HPHT capsule and one located in an upper region of the HPHT capsule. In certain configurations the seeds are disposed between graphite and metal catalyst (flux) layers and are not anchored to a seed pad. In certain other configurations the seeds are embedded in respective seed pads, i.e. an upper and lower seed pad are provided with a seed anchored to each pad.

While such a process and HPHT capsule construction would appear to open the possibility of running a pressure driven growth process over long periods of time to achieve growth of large single crystal diamonds, Masao Wakatsuki and co-workers found that this was not possible and identified a major problem with their approach. In particular, Masao Wakatsuki and co-workers found that while their method was successful at reducing spontaneous nucleation and achieving controlled diamond seed growth, the seed growth terminates after a certain length of time and they found it impossible to grow over long periods of time to achieve large single crystal diamond, e.g. greater than 2 mm. They attributed this termination mechanism to the regrown graphite. It is taught that the regrown graphite coating the original graphite source material does not act as a carbon supply itself for diamond growth and continues growing during diamond growth eventually forming a dense layer over the source graphite and terminating diamond growth by cutting off the carbon source.

As such, Masao Wakatsuki and co-workers present a conundrum. They teach that regrown graphite can be provided to alleviate the problems of spontaneous nucleation in a pressure driven diamond growth process. This is required to achieve controlled seed growth of large single crystal diamonds having uniform size and morphology. However, they teach that regrown graphite functions to terminate diamond seed growth prior to achieving large single crystal diamonds. It is perhaps for this reason that the temperature gradient method has remained the standard process for growing large synthetic HPHT single crystal diamond material.

In light of the above, it is an aim of certain embodiments of the present invention to provide an alternative approach to increasing the number of relatively large single crystal diamonds which can be grown in a single HPHT synthesis run. In particular, it is an aim of certain embodiments of the present invention to achieve this goal while also retaining a level of uniformity in diamond growth and a relative simplicity in process configuration and control which is difficult or impossible to attain using the previously described approaches. Accordingly, certain embodiments aim to achieve the following targets: (i) synthesis of single crystal diamonds which are larger than those achievable using the basic HPHT diamond grit configuration and larger than those achievable using the two-step process described by Masao Wakatsuki and co-workers; (ii) synthesis of a larger number of single crystal diamonds per growth run than is achievable using the standard temperature gradient method; and (iii) synthesis of large single crystal diamonds which have a relatively uniform size and morphology using a manufacturing configuration which is more simple to operate and control in a reproducible and uniform fashion when compared to the previously described methods.

SUMMARY OF INVENTION

A first aspect of the present invention provides a method for manufacturing a plurality of synthetic single crystal diamonds, the method comprising:
  forming a plurality of seed pads, each seed pad comprising a plurality of single crystal diamond seeds anchored to, or embedded in, an inert holder;
  loading a carbon source, a metal catalyst, and the plurality of seed pads into a capsule;
  loading the capsule into a high pressure high temperature (HPHT) press; and
  subjecting the capsule to a HPHT growth cycle to grow single crystal diamond material on the plurality of single crystal diamond seeds, the HPHT growth cycle comprising:
  initiating HPHT growth of single crystal diamond material on the plurality of single crystal diamond seeds by increasing pressure and temperature;
  maintaining HPHT growth of single crystal diamond material on the plurality of single crystal diamond seeds via a pressure driven growth process by controlling and maintaining pressure and temperature; and
  terminating HPHT growth of single crystal diamond material on the plurality of single crystal diamond seeds by reducing pressure and temperature,
  wherein the plurality of single crystal diamond seeds remain anchored to, or embedded in, the inert holders during the HPHT growth cycle.

A second aspect of the present invention provides an apparatus for performing the previously described method, the apparatus comprising:
  a capsule comprising a plurality of seed pads and reactants including a carbon source and a metal catalyst, wherein the reactants and seed pads are provided in alternating layers, and wherein each seed pad comprises a plurality of single crystal diamond seeds anchored to, or embedded in, an inert holder; and
  a HPHT press comprising a heating circuit configured to maintain a substantially uniform temperature throughout the capsule whereby diamond growth on the single crystal seeds is achieved via a pressure driven growth process.

The present invention provides a pressure driven, seed-pad configuration similar in some respects to that described by Masao Wakatsuki and co-workers. However, the presently claimed invention is capable of achieving long growth runs and larger single crystal HPHT diamond product without suffering the termination mechanism attributed by Masao Wakatsuki and co-workers to regrown graphite.

A key feature of the present invention is the provision of a plurality of seed pads, each seed pad comprising a plurality of single crystal diamond seeds which remain anchored to, or embedded in, an inert holder during the HPHT growth cycle. The present inventors have found that increasing the number of seeds per unit area on each seed pad (i.e. increasing the 2D spatial density on each seed pad) decreases the chance of spontaneous nucleation in the graphite matrix away from the seed surfaces. It has been found that this effect is sufficient to increase the size of the pressure window between $P_1$ and $P_2$ allowing an operating pressure $P_3$ to be maintained within this pressure window to achieve controlled growth of diamond seeds in a pressure driven multi-seed-pad process without substantial spontaneous nucleation. As such, surprisingly it has been found that the provision of multiple seeds per seed pad can be used as an alternative to the provision of a regrown graphite coating thus avoiding the termination mechanism described by Masao Wakatsuki and co-workers. With this apparently simple modification it has been possible to achieve: (i) synthesis of single crystal diamonds which are larger than those achievable using the basic HPHT diamond grit configuration and larger than those achievable using the two-step process described by Masao Wakatsuki and co-workers; (ii) synthesis of a larger number of single crystal diamonds per growth run than is achievable using the standard temperature gradient method; and (iii) synthesis of large single crystal diamonds which have a relatively uniform size and morphology using a manufacturing configuration which is more simple to operate and control in a reproducible and uniform fashion when compared to the previously described methods.

It should be noted that providing more seeds per unit area within the capsule is completely contrary to the prior art understanding that reducing the number of seeds per unit area of a seed pad requires a reduction in temperature gradient if issues with metal inclusions are to be avoided. Following this logic it would be expected that a small number of seeds should be provided in the capsule to avoid metal inclusions during growth of single crystal diamond material in a pressure driven seed pad growth process in which the temperature gradient is minimized. This may explain why Masao Wakatsuki and co-workers have utilized only one seed per seed pad in their described synthesis process. The present invention goes completely against these prior art teachings and shows that the provision of a large number of seeds is desirable for achieving growth of large, high quality single crystal diamond material in a pressure driven multi-seed pad configuration.

Embodiments of the present invention thus provide multiple inert seed pads with a plurality of seeds anchored to each pad to increase the volume of reactant mixture which is carbon depleted by the seeds during growth. Relatively uniform pressure and temperature conditions throughout the reaction capsule ensure that all the seeds are exposed to substantially the same growth conditions to obtain substantially uniform product and pressure is controlled so as to remain above that required for diamond growth on seeds but below that which results in substantial spontaneous nucleation, i.e. a pressure driven rather than a temperature gradient driven growth process such that substantially the same growth conditions are provided throughout the reaction capsule.

Useful preferred features of embodiments of present invention further aid in achieving growth of large, high quality single crystal diamond material in a pressure driven multi-seed pad configuration while limiting spontaneous nucleation. For example, seed sizes and spatial distributions may be optimized for a target size of single crystal HPHT synthetic diamond growth such that a majority, and preferably substantially all, of the reaction mixture volume is depleted of carbon by seed growth. Furthermore, reactants can be optimized to inhibit spontaneous nucleation and promote high quality single crystal HPHT synthetic diamond growth including using highly crystalline graphite material and by using a relatively high ratio of metal catalyst to graphite. Further still, pressure and temperature conditions during the diamond growth cycle can be optimized to maintain diamond growth on the seeds while minimizing spontaneous nucleation. For example, gradually decreasing temperature during a growth run, while remaining in the temperature-pressure region required for diamond growth, aids in maintaining the required pressure for sustaining seed growth. Advantageously, this temperature decrease can be used in combination with pressure control to maintain an optimum overpressure for high quality diamond growth.

BRIEF DESCRIPTION OF THE DRAWINGS

For a better understanding of the present invention and to show how the same may be carried into effect, embodiments of the present invention will now be described by way of example only with reference to the accompanying drawings, in which.

DETAILED DESCRIPTION OF CERTAIN EMBODIMENTS

Figure 1:
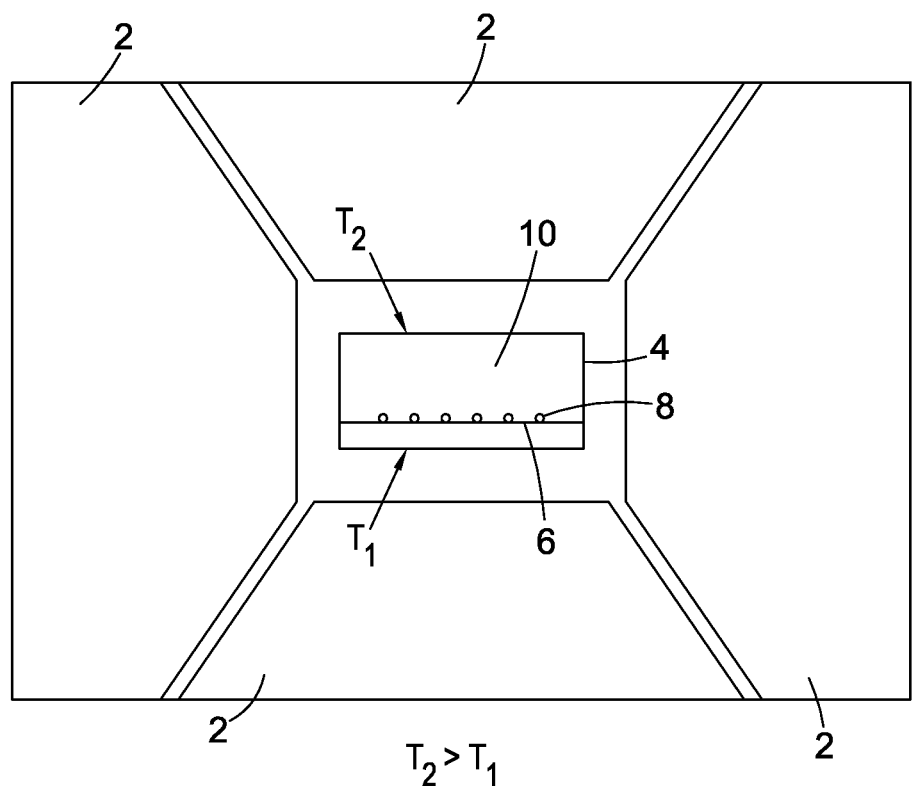
FIG. 1 illustrates a capsule arrangement in a HPHT press for a prior art temperature gradient process.

As described in the background section, FIG. 1 illustrates a capsule arrangement in a HPHT press for a prior art temperature gradient process. The HPHT press comprises anvils 2. A capsule 4 is loaded within the HPHT press. The capsule 4 includes a seed pad 6 on which diamond seeds 8 are disposed. Reactants 10 including a carbon source material and a metal catalyst are disposed over the seed pad. A temperature difference between the top and bottom sides of the capsule ($T_2 > T_1$) is generated and maintained to drive growth. The temperature gradient method is capable of forming a plurality of relatively large single crystal diamonds in a single process run. However, only a single seed pad is provided towards a lower region of the capsule to ensure that all the seeds are located at the same position (i.e. height) relative to the temperature gradient.

Figure 2:
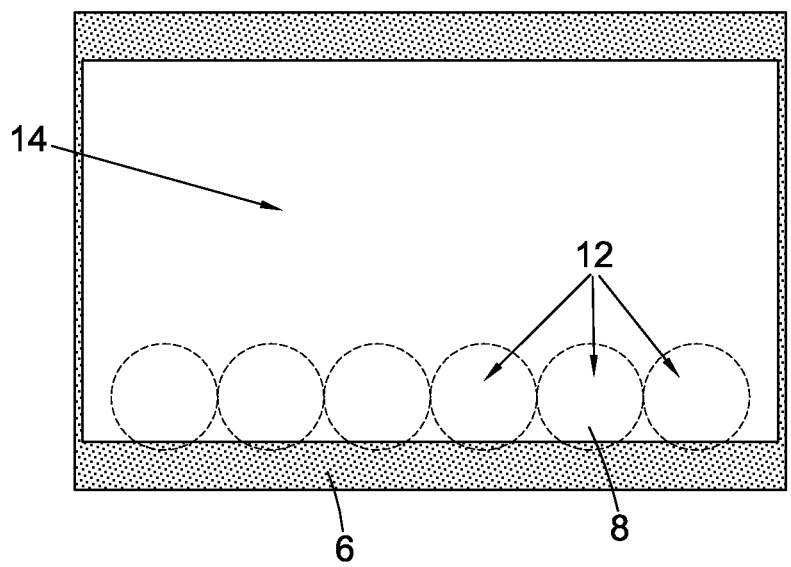
FIG. 2 illustrates how reaction mixture is affected by carbon diffusion towards the seeds in a prior art temperature gradient process.

FIG. 2 illustrates how reaction mixture is affected by carbon diffusion towards the seeds in the prior art temperature gradient process. A carbon depleted region 12 forms around each of the seeds 8 disposed on the seed pad 6. These carbon depleted regions are less prone to spontaneous nucleation. However, a large region of reactant 14 in a middle and upper portion of the reaction volume is not carbon depleted and is prone to spontaneous nucleation. Spontaneous nucleation in these regions is alleviated in a temperature gradient process by ensuring that the temperature is higher in these regions such that carbon is driven into solution. However, in a pressure driven process, in which a substantially uniform temperature is provided throughout the reaction volume, spontaneous nucleation in a middle and upper portion of the reaction volume has been found to be problematic using this configuration.

Figure 3:
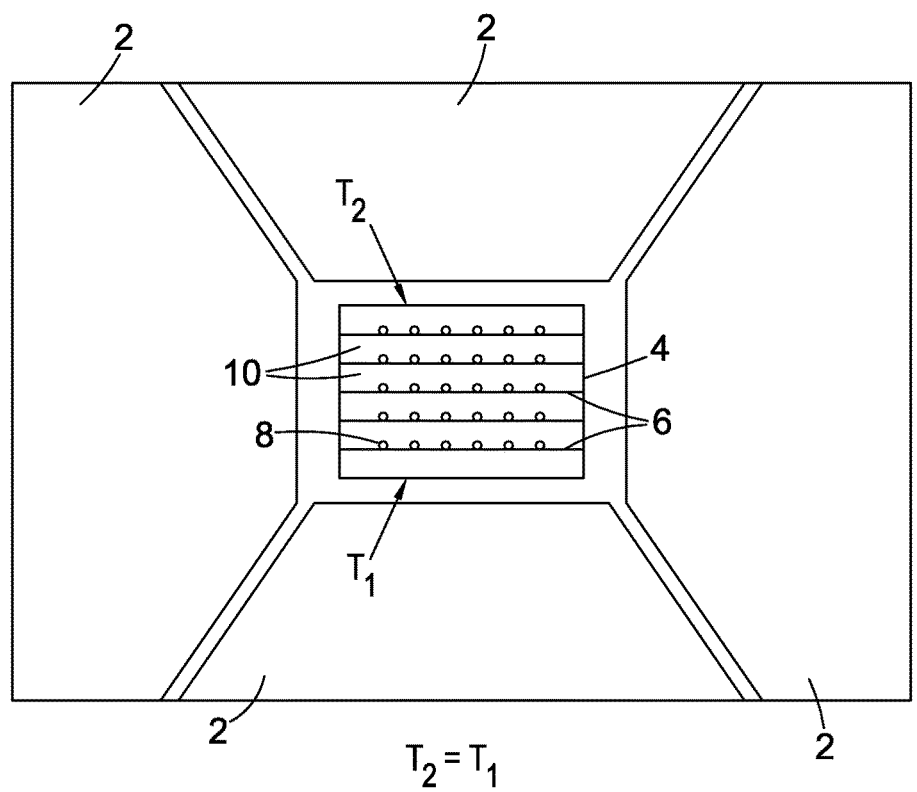
FIG. 3 illustrates a capsule arrangement in a HPHT press for a pressure driven process comprising stacked layers of seed pads according to an embodiment of the present invention.

FIG. 3 illustrates a capsule arrangement in a HPHT press for a pressure driven process using stacked layers of seed crystals with multiple seeds per seed pad. The HPHT press comprises anvils 2. A capsule 4 is loaded within the HPHT press. The capsule 4 includes a plurality of inert seed pads 6, each seed pad comprising a plurality of diamond seeds 8 anchored thereto. Reactants 10 including a carbon source material and a metal catalyst are disposed between the plurality of seed pads. The arrangement is distinguished over the temperature gradient process illustrated in FIG. 1 by the provision of a plurality of stacked inert seed pads and the maintenance of a substantially uniform temperature distribution within the capsule ($T_2 = T_1$ or at least controlled to be within a small temperature differential).

Figure 4:
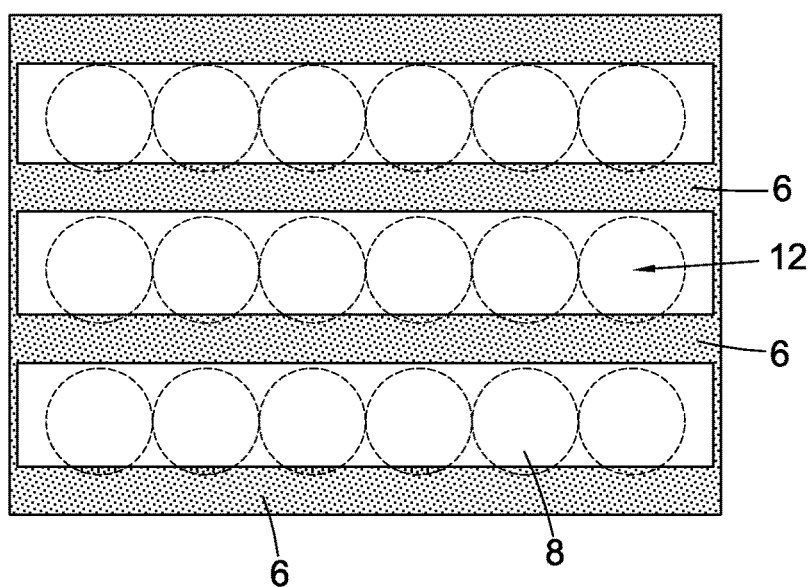
FIG. 4 illustrates how reaction mixture is affected by carbon diffusion towards the seeds in a multi-seed/multi-seed-pad pressure driven process according to an embodiment of the present invention.

FIG. 4 illustrates how reaction mixture is affected by carbon diffusion towards the seeds in a multi-seed/multi-seed-pad pressure driven process according to an embodiment of the present invention. As with the single seed pad arrangement illustrated in FIG. 2, a carbon depleted region 12 forms around each of the seeds 8 and these carbon depleted regions are less prone to spontaneous nucleation. However, unlike the arrangement illustrated in FIG. 2, by providing multiple seed pads 6 with multiple seeds per pad it is possible to ensure that a majority of the reaction mixture is depleted of carbon. As such, the provision of a temperature gradient to alleviate spontaneous nucleation in middle and upper regions of the reaction volume is not required and relatively uniform pressure and temperature conditions can thus be provided throughout the reaction capsule to ensure that all the seeds are exposed to substantially the same growth conditions. This enables substantially uniform product and the pressure and temperature can be controlled so as to remain above that required for diamond growth on seeds but below that which results in substantial spontaneous nucleation, i.e. a pressure driven rather than a temperature gradient driven growth process such that substantially the same growth conditions are provided throughout the reaction capsule.

Figure 5:
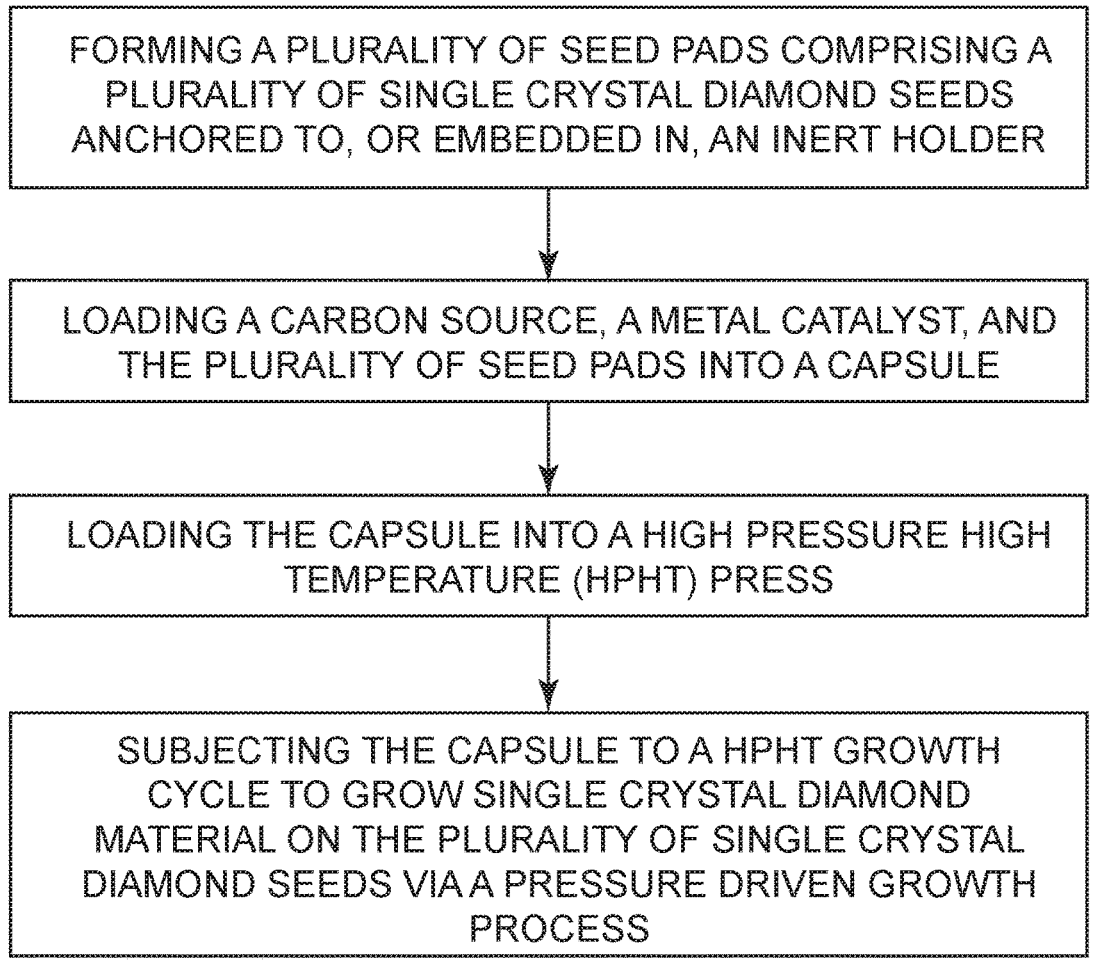
FIG. 5 shows a flow diagram illustrating the steps involved in performing the manufacturing method according to an embodiment of the present invention.

FIG. 5 shows a flow diagram illustrating the method steps involved in manufacturing a plurality of synthetic single crystal diamonds according to an embodiment of the present invention. The method comprises:

forming a plurality of seed pads comprising a plurality of single crystal diamond seeds anchored to, or embedded in, an inert holder;

loading a carbon source, a metal catalyst, and the plurality of seed pads into a capsule;

loading the capsule into a high pressure high temperature (HPHT) press; and subjecting the capsule to a HPHT growth cycle to grow single crystal diamond material on the plurality of single crystal diamond seeds via a pressure driven, rather than temperature gradient driven, process by controlling and maintaining pressure and temperature.

Figure 6:
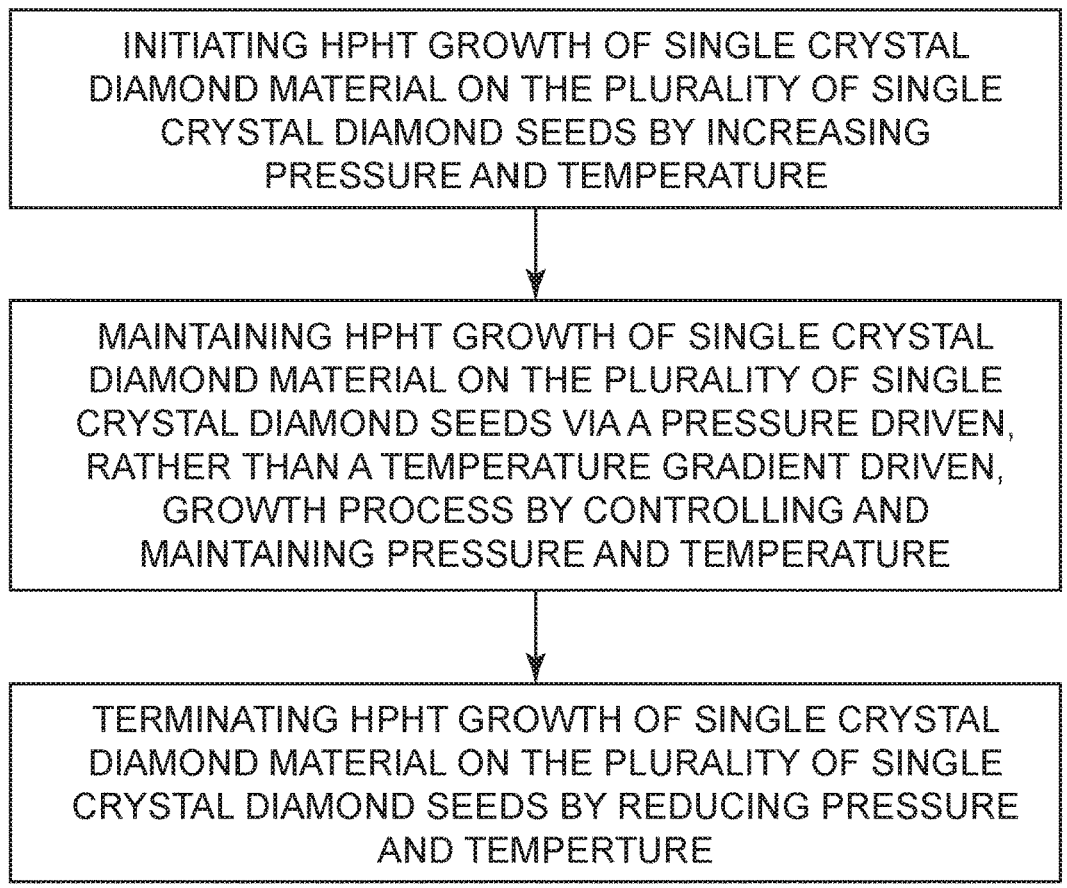
FIG. 6 shows a flow diagram illustrating a HPHT growth cycle according to an embodiment of the present invention.

FIG. 6 shows a flow diagram illustrating a HPHT growth cycle which comprises:

initiating HPHT growth of single crystal diamond material on the plurality of single crystal diamond seeds by increasing pressure and temperature;

maintaining HPHT growth of single crystal diamond material on the plurality of single crystal diamond seeds via a pressure driven growth process by controlling and maintaining pressure and temperature; and terminating HPHT growth of single crystal diamond material on the plurality of single crystal diamond seeds by reducing pressure and temperature.

The present inventors have found that it is possible to utilize a pressure driven, as opposed to a temperature gradient driven process in a multi-layered capsule configuration to form a large number of relatively large, uniform single crystal diamonds in a single growth run. Key features of certain embodiments of the present invention include stacked layers of inert seed pads, large numbers of seeds per unit area, even temperature distribution across the layers and from layer to layer, and low variations in internal pressure and temperature.

Embodiments of the present invention provide a HPHT process which runs with a reasonable constant pressure and a reasonably constant temperature, at least over a majority of the growth process. In this regard, the process is more similar to the previously described grit process than the temperature gradient method as a relatively uniform temperature across the capsule is desirable. In contrast, embodiments are more similar to the temperature gradient method in that the seeds are anchored to an inert seed pad which is not the case for the grit process. In this regard, the present process is distinguished over the temperature gradient process by the provision of multiple inert seed pads in addition to the use of uniform temperature.

As described in the summary of invention section, increasing the number of anchored seeds has been surprisingly found to negate the requirement for a regrown graphite coating to inhibit spontaneous nucleation of diamond growth in the graphite matrix as described by Wakatsuki and co-workers.

Using multiple seeds per pad in a stacked seed pad—pressure driven arrangement it is possible to achieve a high graphite to diamond conversion and a large number of relatively large single crystal diamonds can be obtained in a single growth run. Embodiments of the present invention have solved the termination problems described in the prior art and thus provided a commercially viable process for seed-pad pressure driven growth of single crystal diamond material with well defined morphologies and large graphite to diamond conversion to achieve large crystal growth. In some respects, the process works on a similar premise to that of the seeded grit process, i.e. that the pressure required to grow diamond seeds is less than that required for spontaneous nucleation. Spontaneous nucleation is undesirable as it will form fine diamond crystals rather than larger single crystal material on the seeds. In fact, sometimes spontaneously nucleated single crystals can become rather large in size but as in the grit process such rogue crystals are mostly highly twinned crystals with undesirable aspect ratios and are undesirable. If a pressure $P_1$ is the pressure required to grow on seeds and a pressure $P_2$ is the pressure required to cause spontaneous nucleation, then it is required to operate at a pressure $P_3$ which lies in between pressures $P_1$ and $P_2$. The amount that pressure $P_3$ exceeds $P_1$ is known as the over-pressure. This over-pressure may be controlled so as to fall within a pressure window in which diamond seed growth occurs but where widespread spontaneous nucleation is avoided, i.e. $P_3$ is maintained between $P_1$ and $P_2$. As diamond growth on the seeds is driven by this over-pressure this process is described as being pressure-driven.

Some preferred embodiments of the present invention are described below. The description includes a section relating to seed and seed pad configurations, a section relating to reaction mixture compositions, and a section relating to diamond growth cycle parameters.

Seed and Seed Pad Configurations

Seeds are typically more numerous than for the temperature driven process but less numerous than for the grit process. Accordingly, carbon transport distance to individual seeds is relatively high compared to the grit process. Regions located around the seed become depleted in carbon as the carbon is taken out of solution during seed growth. More carbon is pulled into solution and diffuses through the depleted region. The concentration gradient in combination with the over-pressure aids in pushing the flow of carbon from the solid graphite state into solution, through the metal solvent in the depleted region, and out of solution into the solid diamond state on the seeds.

The number of seeds per seed pad, the number of seed pads in the capsule, and the dimensions of the capsule may be varied according to particular embodiments. However, it should be noted that a carbon depletion zone of reacting material forms around the seeds. As such, the seeds should be sufficiently spaced so as to allow this carbon depletion zone to form around individual seeds without interference from adjacent seeds. Furthermore, fewer seeds will tend to grow larger HPHT single crystal diamonds as each seed has access to what is effectively a larger reservoir of carbon. That said, it has been found that for many applications, each seed pad can be loaded with a number of single crystal diamond seeds in a range 8 to 3000, 30 to 1500, 50 to 800, or 80 to 650. Furthermore, the capsule can be loaded with a number of seed pads in the range 4 to 30, 4 to 20, 6 to 15, or 8 to 10. As such, the capsule as a whole may comprise a number of single crystal diamond seeds in a range 32 to 108000, 150 to 30000, 350 to 12000, or 450 to 6000.

Figure 7:
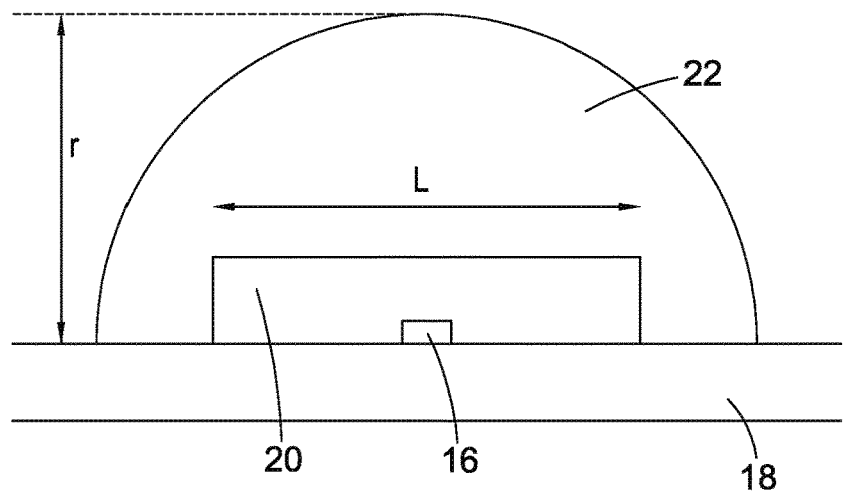
FIG. 7 illustrates a cross-sectional view of a portion of a seed pad showing the relationship between the size of single crystal HPHT synthetic diamond and the size of a surrounding carbon depleted region.

Of course, the number of seeds will be dependent to some extent on the volume of the capsule, the amount of graphite material which can be loaded into the capsule to feed HPHT diamond growth of a large number of seeds, and the target size of the single crystal HPHT synthetic diamond material to be grown on the seeds. That said, it has been found that the size of the carbon depleted region associated with a seed can be equated to the size of the single crystal HPHT synthetic diamond grown on the seed by the equation $r=0.81 \times L$ where r is the radius of the carbon depleted region associated with a seed (also known as a "seed cell") and L is the longest edge length of the single crystal HPHT synthetic diamond grown on the seed. FIG. 7 illustrates a cross-sectional view of a portion of a seed pad showing a single seed 16 disposed on a seed pad 18 with a single crystal HPHT synthetic diamond 20 having a length L grown thereon. A seed cell 22 of carbon depleted reactant of radius r surrounds the single crystal HPHT synthetic diamond 20. The optimum seed configuration will be one in which carbon depleted seed cells form a close packed array to maximize the area of carbon depleted zones without overlap which would otherwise cause interference between adjacent single crystal HPHT synthetic diamonds during growth. As there is an approximate relationship between the size of the seed cells and the size of the single crystal HPHT synthetic diamond it is possible to calculate optimum seed configurations to achieving a close packed array of seed cells for a given size of single crystal HPHT synthetic diamond to be grown. For a single crystal HPHT synthetic diamond of 1 mm edge length, each seed pad may be provided with a density of single crystal seeds of approximately 45 seeds $cm^{-1}$. In contrast, for a single crystal HPHT synthetic diamond of 12 mm edge length, each seed pad may be provided with a density of single crystal seeds of approximately 0.3 seeds $cm^{-1}$. Accordingly, depending on the size of single crystal HPHT synthetic diamonds to be grown, each seed pad may comprise a density of single crystal diamond seeds in a range 0.3 to 45, 0.5 to 30, 0.8 to 20, or 1.0 to 10 seeds $cm^{-2}$. Similarly, optimum seed pad spacing can be calculated for a target size of single crystal HPHT synthetic diamonds. Accordingly, depending on the size of single crystal HPHT synthetic diamonds to be grown, the seeds pads may be spaced apart within the capsule such that a distance between the seeds pads is selected to be in a range 1.0 to 12 mm, 1.5 to 10 mm, 2.0 to 8.0 mm, 2.5 to 7.0 mm, or 3.0 to 6.0 mm.

While in certain embodiments all of the seed pads will have the same number of seeds mounted thereon, it is also envisaged that the seeds pads may have different numbers of seeds. However, two or more of the seed pads must comprise a plurality of seeds in accordance with the present invention.

As embodiments of the present invention aid in maximizing the use of the reaction volume, it is particularly beneficial to use large volume presses. For example, the capsule may have a volume no less than 100 $cm^3$, 500 $cm^3$, 1000 $cm^3$, 1500 $cm^3$, 2000 $cm^3$, or 2500 $cm^3$. Furthermore, the capsule may comprise a density of single crystal diamond seeds in a range 0.3 to 45, 0.5 to 30, 0.8 to 20, or 1.0 to 10 seeds $cm^{-3}$. Such volumes and packing densities allow a large number of single crystal HPHT synthetic diamonds to be grown in a single growth cycle.

A range of different seed sizes and crystallographic orientations may be used with the presently described method. For example, the single crystal diamond seeds may have a longest dimension of at least 50 μm, 100 μm, 200 μm, 300 μm, 400 μm, 500 μm, 600 μm, 700 μm, 800 μm, 900 μm, 1 mm, 2 mm, 3 mm, or 4 mm. Larger seed sizes may be used to form larger HPHT diamond product. Typically, the single crystal seeds will have a longest dimension less than 10 mm, 5 mm, 3 mm, 2 mm, 1 mm, 900 μm, 800 μm, 700 μm, 600 μm, 500 μm, 400 μm, 300 μm, 200 μm, or 100 μm. Smaller seeds reduce the contact area and stress generated between the seeds and the overlying diamond material grown thereon thus reducing problems of cracking. As such, a balance in seed size may be found to grow sufficiently large material while avoiding problems of cracking. For example, seed sizes may fall in a range 100 μm to 1 mm, 200 μm, to 800 μm, 400 μm to 800 μm, or 500 μm to 800 μm.

It has also been found that the ratio of HPHT diamond growth size to seed size can be increased by using asymmetric log-shaped seeds. In this case, the single crystal diamond seeds may comprise an asymmetric growth surface having a length greater than a width by a factor of at least 1.5, 2, or 3. Whatever size, shape, and crystallographic orientation is utilized for the seeds, to form uniform product the large number of seeds used by the presently described method should preferably be selected to have uniform characteristics. For example, the plurality of single crystal diamond seeds within the capsule may have a substantially equal longest dimension to within 30%, 20%, 10%, or 5% of a mean value. Alternatively, the seeds may be selected to have uniform characteristics within each seed pad, but vary from one seed pad to the next. For example, the plurality of single crystal diamond seeds within one seed pad may have a substantially equal longest dimension to within 30%, 20%, 10%, or 5% of a mean value.

In addition, it can also be advantageous to providing thin layers of reaction mixture and a large number of seed pads within the capsule in an alternating fashion. By decreasing the distance between seed pads, the ratio of seed surface area to quantity or volume of carbon source above each seed pad is increased. This can aid in reducing the possibility of spontaneous nucleation within the reaction mixture above the seeds as the seeds provide numerous carbon sinks for a relatively low volume of available carbon source material such that growth at the seeds is dominant over spontaneous nucleation. In addition, a relatively small distance between adjacent seed pads provides a vertical restriction to seed growth. This can be useful in encouraging lateral growth by providing a geometric constraint. This also enables the solvent layer thickness to be minimized thereby increasing the number of seed layer opportunities, increasing the seed density, and effectively increasing the pressure window in which diamond growth on the seed pads can be achieved at the expense of spontaneous nucleation within the solvent layers. For example, the distance between each seed pad may be expressed as a function of the height of the HPHT diamond material grown on the seed pads such that the distance between the seed pads is no more than a factor of 10, 5, 3, 2, 1.5 or 1.2 times the height of the as-grown single crystal HPHT diamond material on the seed pads. In certain arrangements the distance between the seed pads may be selected to be no less than a factor of 1.0, 1.2, 1.5, or 2.0 times the height of the as-grown single crystal diamond material on the seed pads. For example, the seed pads may be spaced apart within the capsule such that the distance between the seed pads is selected to be in a range 1 to 10, 1.2 to 5.0, 1.2 to 3.0, or 1.2 to 2.0 times the height of the as-grown single crystal diamond material on the seed pads.

The seed pads may be mounted within the capsule in a number of possible configurations. For example, each of the plurality of seed pads may be oriented in a substantially horizontal plane, the plurality of seed pads being stacked one over the other in a vertical direction such that each seed pad is substantially perpendicular to gravity. Alternatively, each of the plurality of seed pads may be oriented in a substantially vertical plane, the plurality of seed pads being stacked one adjacent the other in a horizontal direction such that each seed pad is parallel to gravity. However, in the later case it has been found that impurity uptake in the HPHT diamond material can be higher. Accordingly, the former arrangement comprising a vertical stack of seed pads as illustrated in FIG. 2 is preferred. One preferred configuration utilizes a cylindrical capsule, the seed pads being in the form of circular disks stacked along a vertical axis of the cylindrical capsule with each seed pad oriented perpendicular to gravity. The observation that the impurity uptake is higher with the seed pads oriented parallel to gravity suggests an impurity uptake mechanism related to gravity.

Reaction Mixture

The source of carbon can be graphite, diamond, other carbonaceous materials, or combinations thereof. Graphite is preferred and this may be in the form of a powder, grains, or flakes. During the growth process, carbon dissolves in the metal solvent and precipitates on the seeds. Carbon transport is via (primarily Fick's) diffusion through the metal solvent. Variations in the graphite can result in nucleation sites and some spontaneous nucleation can occur away from the diamond seeds. This can be reduced by selecting good quality ordered flakes of graphite rather than disordered graphite powder. The crystallinity of the graphite material can be measured by X-ray diffraction (XRD). For example, the graphite material may have a (002) diffraction line with a half-peak width of 0.5 degrees or less as measured using a copper $K_\alpha$ line at an acceleration voltage of 40 kV.

The need for a regrown graphite coating as described by Wakatsuki and co-workers can be negated by selected good quality graphite material as the carbon source (low impurity, high crystallographic quality) in addition to optimizing seed configurations as previously described. That said, certain embodiments of the present invention can also be used in conjunction with a graphite re-crystallization step to further inhibit spontaneous nucleation during seed growth. It has also been found to be advantageous to provide the carbon source and the metal catalyst as an intimate mixture. As such, advantageously methods according to the present invention comprise mixing the carbon source with the metal catalyst to form a reaction mixture prior to loading the reaction mixture and the plurality of seed pads into the capsule to form alternating layers of reaction mixture and seed pads. This contrasts with the arrangements described by Wakatsuki and co-workers which use a layered reactant structure with a layer of metal solvent disposed over a seed and a graphite disk disposed over, and spaced apart from, the seed. Wakatsuki and co-workers have described that this arrangement can aid in controlling seed growth. However, this arrangement provides a single planar surface of graphite opposite the seed crystal and thus a low surface area for the dissolution of carbon into the metal catalyst solvent. The prior art describes that regrown graphite coats the original graphite and eventually cuts off the carbon source resulting in termination of seed growth. In contrast, the present inventors have found that by providing a mixture of graphite and metal solvent, for example a powdered mixture, the surface area of the graphite in contact with the metal solvent is significantly increased thus providing a much larger surface area over which any regrown graphite would need to be coated prior to termination. It has been found that using a reaction mixture it is possible to continue growth over much longer time periods than those described by Wakatsuki and co-workers and grow large crystals. That is, the provision of a reaction mixture (rather than a solid graphite disk and metal solvent layer) increases the means of carbon transport into the metal solvent by providing intimate connectivity between the graphite and metal and thus facilitates diffusion of carbon into the solvent to the seed crystals. While such reaction mixtures are known, for example, in a grit-type process, they go completely against the teachings of the prior art directed to multi-seed pad pressure driven processes which specifically teach that it is advantageous to provide a discrete metal layer and a discrete graphite disk, with the layer of metal between the graphite and the seeds to control seed growth.

In addition to the above, it is noted that Wakatsuki and co-workers describe re-growth of graphite on the surface of source graphite material (with the majority of the source graphite material remaining unchanged) and that the regrown graphite does not function as a carbon source. In contrast, the present inventors have found that if a graphite re-crystallization step is provided prior diamond growth, such a step may be performed at a temperature, pressure, and time interval sufficient to achieve full reconstitution of all or substantially all the source graphite material into a re-crystallized form. During the subsequent diamond growth process the re-crystallized graphite material functions as the carbon source for diamond seed growth. This contrasts with the regrown graphite described by Wakatsuki and co-workers which which does not function as a carbon source but rather functions as a buffer layer for carbon dissolution from the original graphite material which has not been re-crystallized.

In light of the above, it has been found to be advantageous to provide the carbon source material as graphite in the form of a powder, grains, or flakes rather than a solid disk. The carbon source material may have a surface area per gram in a range 0.001 $m^2/g$ to 10 $m^2/g$, 0.01 $m^2/g$ to 4 $m^2/g$ or 0.05 $m^2/g$ to 1.9 $m^2/g$. Furthermore, the carbon source material preferably has a total impurity level (ash content) no more than 0.1%, 0.05%, 0.02%, 0.015%, 0.01%, or 0.005% by weight.

Reaction mixtures for use in embodiments of the present invention typically comprise a higher carbon content than for the temperature gradient method but lower than for the grit process. For example, the reaction mixture may comprise a carbon (graphite) content in a range 5% to 60%, 9% to 50%, 14% to 40%, 16% to 35%, 18% to 30%, or 20% to 30% by weight prior to HPHT growth. The reaction mixture may comprise a metal catalyst content in a range 40% to 95%, 60% to 90%, 65% to 85%, or 70% to 80% prior to HPHT growth. Suitable metal catalysts include one or more of nickel, cobalt, iron, and manganese, preferably in the following combinations: NiFe, CoFe, NiFeCo or NiFeCoMn. Other catalysts and combinations thereof known in the art may also be used A higher metal content when compared to the grit process can aid in avoiding spontaneous nucleation and effectively increase the window in which an over-pressure can be applied without causing spontaneous nucleation. It is also considered that a higher metal concentration can also result in a lower uptake of metal inclusions and thus provide better quality product. This may be considered to be counter-intuitive. However, it should be noted that a lower carbon content results in a lower growth rate and thus reduces the chance of metal entrapment in the growing diamond material. That is, reduced carbon content increasing the length scale over which carbon must be transported to the seeds reduces the concentration gradient dC/dx and thus lowers growth rate leading to better quality diamond material with fewer metal inclusions. Furthermore, the time scale for large single crystal growth is longer and the carbon depleted regions around the seeds may grow larger during growth, thus requiring carbon to be transported over longer distances through larger carbon depleted regions around the growing seeds.

The use of a carbon source material which is disposed close to the seed crystals is also thought to be advantageous in order to provide a small path length from the graphite to the seed crystals for diffusion of carbon from the carbon source to the seed crystals to achieve seed growth. For example, it can be advantageous to provide an arrangement in which at least a portion of the carbon source material is located less than 0.1 mm, 0.05 mm, 0.02 mm, or 0.01 mm from the single crystal diamond seeds. This may be provided by using a reaction mixture comprising an intimate mixture of graphite and metal catalyst disposed immediately above the seeds. This contrasts with the teachings of Wakatsuki and co-workers who specifically teach that it is advantageous to provide a discrete metal layer and a discrete graphite disk, with the layer of metal between the graphite and the seeds to control seed growth. Wakatsuki and co-workers suggest that the provision of a thick layer of metal catalyst between the graphite and seeds is advantageous and that the thickness of the metal catalysts layer affects the diamond growth speed and crystal quality. It is suggested that a suitable thickness allows better pressure control for seed growth without spontaneous nucleation. However, the present inventors have found that by providing a large number of seeds per unit area it is possible to negate this requirement and that carbon transport to the diamond seeds can be increased by increasing the concentration of carbon source material near the diamond seeds. This may aid in preventing termination of carbon flow from the source material to the seeds. As such, the provision of a reaction mixture rather than a discrete thick metal catalyst layer can be advantageous. Alternatively, if a discrete metal layer is provided between the diamond seeds and the carbon source material then the metal layer may be pre-doped with graphite material to ensure that a suitable quantity of graphite is disposed near the seeds. In this regard, it may be noted that the diffusion coefficient of carbon is sensitive to the concentration of carbon in the metal solvent. Increasing the concentration of carbon increases the diffusion coefficient and thus aids carbon transport to the seeds.

Diamond Growth Cycle

In light of the above, it is evident that providing a plurality of seeds per pad increases the number of carbon sinks and reduces the risk of spontaneous nucleation elsewhere in the capsule. Furthermore, providing a reaction mixture comprising a highly crystalline, high purity carbon source which has a large surface area and is intimately mixed with metal catalyst and located close to the seeds can further reduce the risk of spontaneous nucleation elsewhere in the capsule while aiding carbon transport to the seeds and alleviating problems of seed growth termination. This section describes how diamond growth cycle parameters such as pressure and temperature can be controlled to drive diamond growth to large sizes on a large number of seeds while minimizing interference from spontaneous nucleation.

To initiate HPHT growth, several possibilities exist to enter the diamond stable region of the carbon phase diagram including: raising the pressure then raising the temperature; raising the temperature then raising the pressure; or raising the pressure and temperature simultaneously. The present inventors have found that it is advantageous to initiate HPHT growth by raising the pressure to a target starting value $P_s$ which is below the Berman-Simon graphite/diamond thermodynamic phase stability line, raising the temperature to a value $T_g$ which exceeds the eutectic temperature for the solvent/catalyst/graphite combination used for synthesis (either before, during, or after raising the pressure, preferably after), holding the temperature at the value $T_g$ for a time t, and then raising the pressure to a target starting value $P_g$ for the maintaining step to initiate HPHT growth. It has been found that by holding the temperature at $T_g$ with the pressure held at a value $P_s$ just below that required for HPHT growth prior to initiating HPHT growth recrystallizes the graphite material. This is particularly useful in combination with the presently described method as the growth process relies on diffusion of graphite material rather than convection transport and good quality re-crystallized graphite material can improve HPHT growth on the seeds by reducing the probability for additional spontaneous nucleation of diamond elsewhere within the reaction volume. For related reasons the selection of the graphite starting materials is also important as previously described. Higher purity/crystallinity graphite raw material can be advantageous in suppressing spontaneous nucleation. Elimination of impurities, e.g. oxides, in the catalyst can be important. This allows for the elimination of competing 'sinks' for the available carbon, and this allows the seed grown diamonds to grow to an optimum size without the possibility of inter-growth with a spontaneously nucleated diamond which can lead to cracking and inclusion up-take. The time t at which the temperature is held at $T_g$ and the pressure is held at $P_s$ below the HPHT growth limit may be in a range 1 to 36000 seconds, for example in a range 20 to 24000 seconds, 40 to 15000 seconds, or 60 to 11000 seconds. The temperature $T_g$ may be in a range 1070 Kelvin to 2470 Kelvin, for example in a range 1370 Kelvin to 1970 Kelvin, 1520 Kelvin to 1770 Kelvin, or 1570 Kelvin to 1670 Kelvin and may be fixed or varied within this range. The pressure $P_s$ may be within 0.01 to 2.0 GPa, 0.05 to 1.5 GPa, 0.1 to 1 GPA, or 0.2 to 0.5 GPa of pressure $P_g$, and may be fixed or varied within these ranges. Furthermore, the pressure $P_g$ may be in a range 4.0 GPa to 8.0 GPa, 4.5 GPa to 7.0 GPa, 5.0 GPa to 6.0 GPa, or 5.2 GPa to 5.7 GPa and may be fixed or varied within these ranges. The pressure is preferably raised relatively rapidly from $P_s$ to $P_g$ in order to initiate HPHT growth. The rate of pressure increase may be in a range 0.001 to 1.0 GPa per minute, 0.01 to 0.8 GPa per minute, 0.01 to 0.5 GPa per minute, or 0.05 to 0.3 GPa per minute. If an initial re-crystallization step is performed for the carbon source material the pressure $P_s$, temperature $T_g$ and time period t of such a step may be controlled whereby at least 50%, 60%, 70%, 80%, or 90% by weight of the carbon source material is re-crystallized.

It can also be advantageous to use a temperature spike at the start of the run, i.e. for a short period heat the catalyst/graphite mixture well above the temperature at which diamond remains stable. This may help to pre-etch the surface of the diamond seeds improving the quality of the growth surfaces.

As a plurality of seed pads are provided, pressure and temperature conditions throughout the capsule must be controlled to be relatively uniform during at least the main portion of the growth cycle. Otherwise, seeds are exposed to different growth conditions (e.g. on different seed pads or across a single seed pad) and will grow at different rates and/or morphologies or, in the extreme, some seeds will not grow at all. The capsule is configured to operate at a target temperature with little or no temperature gradient such that diamond growth is pressure driven using diffusion material transport rather than temperature gradient driven using thermal convection current material transport. For example, a temperature difference between a top side and a bottom side of the capsule may be maintained to be no more than 100 Kelvin, 50 Kelvin, 30 Kelvin, 20 Kelvin, 10 Kelvin, 5 Kelvin, or 1 Kelvin. A temperature gradient between the top side and the bottom side of the capsule may be maintained to be no more than 0.66 Kelvin mm$^{-1}$, 0.50 Kelvin mm$^{-1}$, 0.33 Kelvin mm$^{-1}$, 0.20 Kelvin mm$^{-1}$, 0.13 Kelvin mm$^{-1}$, 0.07 Kelvin mm$^{-1}$, 0.03 Kelvin mm$^{-1}$, or 0.01 Kelvin mm$^{-1}$.

The temperature of the capsule may be maintained at a temperature in the range 1070 Kelvin to 2470 Kelvin, 1370 Kelvin to 1970 Kelvin, 1520 Kelvin to 1770 Kelvin, or 1570 Kelvin to 1670 Kelvin during HPHT growth of single crystal diamond material on the plurality of single crystal diamond seeds. A heating circuit and insulator components may be provided which are tuned to minimize temperature gradients. That is, the heat generated in the heating element is optimized to match the heat losses from the capsule and so achieve a uniform temperature distribution throughout the metal solvent and seed pad structures.

During HPHT growth of single crystal diamond material on the plurality of single crystal diamond seeds the temperature of the capsule may be maintained at a temperature within 15%, 8%, or 5%, of the temperature generated by the initiating step. However, it has been found that slowly lowering the temperature during a growth run, while remaining in the temperature-pressure region required for diamond growth, can aid in maintaining the required pressure for sustaining seed growth while alleviating spontaneous nucleation. Accordingly, this temperature reduction method during the maintaining step of the HPHT growth process may also be used as a means of counteract the growth termination mechanism described in the prior art. During the maintaining step the temperature may be decreased in a continuous or stepwise manner while maintaining growth of single crystal diamond material on the plurality of single crystal diamond seeds. For example, the temperature may be decreased at a rate in the range 0.1 Kelvin/hour to 2 Kelvin/hour, 0.3 Kelvin/hour to 1.5 Kelvin/hour or 0.5 Kelvin/hour to 0.75 Kelvin/hour.

Advantageously, the pressure within the capsule should be maintained within a target range 4.5 to 8 GPa, 5.0 to 6.5 GPa, 5.2 to 5.9 GPa, or 5.4 to 5.7 GPa during HPHT growth of single crystal diamond material on the plurality of single crystal diamond seeds and/or within 12%, 6%, or 3% of the pressure generated by the initiating step.

In this regard, it should be noted that as graphite material is converted into diamond material the volume of the reaction mixture falls leading to a pressure drop. The associated pressure drop can reduce or completely halt HPHT diamond growth. As such, the HPHT press (including the tooling and gasket (pressure containing) configuration) must be configured such that the pressure applying bodies have a relatively long stroke and the pressure applying bodies should advantageously be moved inwards during HPHT growth to maintain the pressure within the target range such that an over-pressure is provided without exceeding the limit at which substantial spontaneous nucleation occurs. That is, in addition to the requirement that there is little or no temperature gradient applied across the capsule, it is also desirable that the pressure is progressively increased during the growth run to maintain graphite to diamond conversion at the desired rate using a controlled over-pressure.

The HPHT growth step may be performed for a time of at least 20 hours, 40 hours, 60 hours, 80 hours, 100 hours, 200 hours, 300 hours, 400 hours, or 500 hours. The time will depend on the size of HPHT single crystal diamond product which is desired, the type of metal solvent utilized, the quantity of carbon source material, and the available capability to maintain a suitable over-pressure. It may be noted that the method as described herein can be operated over large timescales to form a large number of large, high quality, uniform, good morphology single crystal HPHT diamonds in a single growth run. In this regard, the simplicity of the presently described approach when compared with more complex multi-layer temperature gradient processes means that long growth runs can be reliably performed while maintaining material quality, uniformity, and crystal morphology.

During the maintaining step the volume of the capsule may reduce by an amount in a range 0.5% to 50%, 0.5% to 30%, 1.0% to 25%, 2.0% to 20%, or 5% to 15%. Over the whole HPHT growth cycle the volume of the capsule may reduce by an amount in a range 10% to 60%, 20% to 50%, 30% to 50%, 35% to 45%, or 35% to 40%. Some of this volume reduction will be due to collapse of capsule components while some of the volume reduction will be due to conversion of carbon source material (graphite) to diamond material. The proportion of volume reduction attributed to each mechanism can be measured by collapsing the capsule under conditions where no diamond conversion occurs. This reduction in volume can then be subtracted from the volume reduction during a diamond growth process to estimate the volume reduction which is due to carbon source to diamond conversion. In this way, it is estimated that over the whole HPHT growth cycle the volume of the capsule reduces by an amount in a range 0.1% to 10%, 0.2% to 5%, 0.5% to 3%, or 0.8% to 2.5% due to carbon source to diamond conversion.

To counter the volume collapse, the press may be configured such that during the maintaining step the press moves anvils inwards by a combined distance in the range 1 mm to 100 mm, 5 mm to 75 mm, 10 mm to 60 mm, 20 mm to 50 mm, or 20 mm to 40 mm as measured from the point at which the anvils contact the capsule. The anvils may be moved inwards in a continuous or step-wise manner during the maintaining step to counteract the volume collapse and associated pressure drop as graphite is converted to HPHT diamond. While intuitively it may be expected that the more effective approach would be to smoothly and continuous compensate for pressure changes, in practice it has been found that a step-wise compensation mechanism is adequate and may even be advantageous if smooth pressure adjustment is problematic due to control issues with the hydraulic pressure. For example, the one or more pressure applying bodies can be moved inwards by a fixed amount at set time intervals to maintain the pressure in the capsule within a suitable operating range. Using this approach, the pressure will drop by a certain amount and then be increased by a certain amount during HPHT growth. However, the pressure within the capsule will remain within a desired operating range, for example within 12%, 6% or 3% of the pressure generated by the initiating step.

During the maintaining step the pressure and temperature can be controlled and maintained to provide a rate of conversion of carbon source material to diamond per seed in a range 0.1 mg/hr/seed to 5 mg/hr/seed, 0.3 mg/hr/seed to 3 mg/hr/seed, 0.5 mg/hr/seed to 2 mg/hr/seed, 0.7 mg/hr/seed to 1.5 mg/hr/seed, or 0.9 mg/hr/seed to 1.2 mg/hr/seed. While intuitively a high rate of growth would seem desirable, in practice high growth rates can lead to uptake of impurities within the growing single crystal diamond material. As such, a compromise must be reached between growth rate and quality of product material. While growth rates per seed for the presently described process can be lower than for a temperature driven process, the large increase in the number of single crystals which can be grown in a single growth run make the presently described process more economic. Furthermore, single crystal diamond product can be grown with a metal content less than 5%, 2%, 1%, 0.5%, 0.1%, 0.05%, 0.01%, or 0.005% by weight, for example in a range 0.01% to 2% by weight. Furthermore, nitrogen containing species of entrapped nitrogen gas within the capsule during growth can be managed such that the nitrogen content in the grown single crystal diamond material may be in a range of 0 to 500 ppm depending on the desired product.

The presently described method is capable of growing single crystal diamond material on a large number of seeds to have a longest dimension no less than 1.0 mm, 1.5 mm, 2.0 mm, 2.5 mm, 3.0 mm, 4.0 mm, 5.0 mm, 7.0 mm, or 10 mm. The single crystal diamond material on the seeds can account for at least 30%, 40%, 50%, 60%, 70%, 80%, or 90% of the total mass of diamond material formed in the capsule during the HPHT growth cycle. For example, if it is desired to fabricate a large number of single crystal diamonds having a longest dimension equal to or greater than 2.0 mm, then such product can be formed in a single growth run and account for at least 30%, 40%, 45%, or 50% of the total mass of diamond material formed in the capsule during the HPHT growth cycle. Furthermore, the rate of conversion of carbon source material to diamond grown to having a longest dimension equal to or greater than 2.0 mm can be controlled to fall a range 0.1 mg/hr/seed to 2 mg/hr/seed, 0.2 mg/hr/seed to 1.5 mg/hr/seed, 0.2 mg/hr/seed to 1.0 mg/hr/seed, 0.3 mg/hr/seed to 1.0 mg/hr/seed, or 0.4 mg/hr/seed to 0.8 mg/hr/seed. Such a rate is advantageous to maintain a balance between growth rates and product quality. Again, a large increase in the number of single crystals which can be grown in a single growth run allows a relatively low growth rate to be used, thus achieving good quality product while still making the process economic.

The presently described process makes efficient use of the reaction volume. For example, the output mass of diamond material relative to a total mass of material loaded into the capsule can be in a range 5% to 40%, 10% to 30%, or 15% to 20% by weight. The output mass of diamond material relative to a total mass of carbon source material loaded into the capsule can be in a range 50 to 95%, 60 to 90%, 70 to 90%, 70 to 85%, or 75 to 85% by weight. As such, a majority of carbon source material is converted to diamond. This contrasts with prior art methods, such as those described by Wakatsuki and co-workers, in which a smaller percentage conversion of carbon source material is achieved. For example, if it is desired to fabricate a large number of single crystal diamonds having a longest dimension equal to or greater than 2.0 mm, then such product can be formed in a single growth run and account for at least 1 to 20%, 2 to 15%, or 4 to 10% of a total mass of material loaded into the capsule and/or 20 to 60%, 25 to 50%, 30 to 45%, or 35 to 40% of a total mass of carbon source material loaded into the capsule.

Another advantageous feature of the presently described process is that it is capable of forming a large number of relatively large single crystal diamonds having a desirable cubic morphology. For example, a cubic morphology having a morphology index value in a range 0 to 3. This contrasts with product from a standard grit-type process which has a more octahedral morphology, for example having a morphology index value in a range 6 to 8. That is, a major advantage of certain embodiments of the present invention is that they are capable of producing a large number of large cubic crystals per growth cycle per volume of capsule. For example, the output mass of cubic single crystal diamond material having a longest dimension equal to or greater than 2.0 mm relative to a total mass of material loaded into the capsule can be in a range 1 to 20%, 2 to 15%, or 4 to 10% whereas the output mass of cubic single crystal diamond material relative to a total mass of carbon source material loaded into the capsule can be in a range 50 to 95%, 60 to 90%, 70 to 90%, 70 to 85%, or 75 to 85%. Furthermore, the output mass per unit capsule volume of cubic single crystal diamond material having a longest dimension equal to or greater than 2.0 mm can be in a range 0.001 g/cm$^3$ to 0.1 g/cm$^3$, 0.005 g/cm$^3$ to 0.05 g/cm$^3$, or 0.01 g/cm$^3$ to 0.03 g/cm$^3$.

To terminate HPHT growth, several possibilities exist to leave the diamond stable region of the carbon phase diagram including: lowering the pressure then lowering the temperature; lowing the temperature then lowing the pressure; or lowering the pressure and temperature simultaneously. Temperature and pressure should be reduced at a sufficiently low rate to avoid thermal induced stress and cracking of diamond product material. Cracking during termination can also be alleviated by the use of relatively small seeds.

Using the above-described diamond growth cycle parameters it is possible to drive diamond growth to large sizes on a large number of seeds while minimizing interference from spontaneous nucleation. In practice, there may still be a certain amount of spontaneous nucleation and this can be measured and used as a figure of merit, i.e. mass ratio of single crystal material grown on the seed pads vs spontaneously nucleated diamond material within the reaction mixture. Preferably, the percentage by weight of single crystal material grown on the seed pads relative to the total mass of diamond material including spontaneously nucleated diamond material within the reaction mixture is equal to or greater than 30%, 40%, 50%, 60%, 70%, 80%, or 90%.

Apparatus

According to a further aspect of the present invention, an apparatus is be configured to perform the manufacturing method as previously described. The apparatus may comprise:

a capsule comprising a plurality of seed pads and reactants including a carbon source and a metal catalyst, wherein the reactants and seed pads are provided in alternating layers, and wherein each seed pad comprises a plurality of single crystal diamond seeds anchored to, or embedded in, an inert holder; and a HPHT press comprising a heating circuit configured to maintain a substantially uniform temperature throughout the capsule whereby diamond growth on the single crystal seeds is achieved via a pressure driven growth process.

Details of the construction of capsule in terms of the form and distribution of reactants and the configuration of the seed pads in terms of sizes, numbers, and distribution of seeds has already been previously described.

A large capsule comprising a large number of seeds can result in a large volume collapse during HPHT growth and it may be difficult to maintain an adequate operating pressure using many standard press designs. For such an arrangement, a press needs to be configured to have a large stroke such that the pressure drop due to volume collapse can be adequately compensated by moving the pressure applying bodies of the press inwards by a large distance. For example, as previously indicated, to counter large volume collapse the press may be configured such that during the maintaining step the press moves anvils inwards by a combined distance in the range 1 mm to 100 mm, 5 mm to 75 mm, 10 mm to 60 mm, 20 mm to 50 mm, or 20 mm to 40 mm as measured from the point at which the anvils contact the capsule.

The apparatus may further comprise a controller for maintaining operating parameters such as pressure and temperature within the previously prescribed ranges. The controller may be pre-programmed to run through a pre-set HPHT growth cycle. Alternatively, the controller may be configured to actively control an individual growth cycle. In this case, the apparatus may be provided with one or more sensors to monitor one or more variables during a HPHT growth cycle and actively change operating parameters to maintain target values. For example, pressure and/or temperature sensors may be provided and the heating circuit and pressure applying bodies adjusted to maintain the temperature and pressure within the desired ranges at the various stages of a HPHT growth cycle.

Comparison of the Present Multi-Seed-Pad Multi-Seed-Per-Pad, Pressure-Driven Process Vs Prior Art Temperature Gradient Processes and Pressure Driven Grit Processes Differences between the present multilayer, pressure-driven process (referred to hereinafter as the MPD process) and the temperature gradient process can be summarized as follows:

(1) The MPD process is pressure-driven rather than temperature-driven and utilizes multiple seed pads rather than a single seed pad. If multiple stacked seed pads were to be utilized in a temperature-driven process then the pads would experience different temperatures and diamond growth would vary between pads.

(2) The MPD process uses a larger number of seeds to achieve the goal of increasing the number of single crystal diamonds fabricated per growth run.

(3) The MPD process advantageously uses a higher carbon content chemistry. This will lower the transport distance when compared to a temperature driven process, which is useful when no temperature differential is provided to drive carbon transport. A higher carbon content is also required to simply provide more carbon source material for growing a larger number of single crystal diamonds when compared to the single seed-pad temperature gradient method.

(4) The MPD process utilizes direct graphite to diamond conversion throughout the growth run. In contrast, the temperature gradient method utilizes an initial graphite to diamond conversion step for the carbon source material, the diamond material then being used as a source of carbon for large single crystal diamond growth. As such, while the volume of the capsule in the temperature driven process remains relatively constant after the initial graphite to diamond conversion step, the MPD process which utilizes direct graphite to diamond seed growth experiences a volume reduction thought the majority of the growth run. Accordingly, the pressure applying bodies (anvils) must be steadily moved inwards to maintain an over-pressure within an operating window which maintains diamond seed growth without undue spontaneous nucleation. Careful pressure control over long time periods is thus required. Furthermore, the pressure applying bodies must be configured to move over relatively large distances in a controlled manner in comparison to prior art arrangements.

(5) The MPD process advantageously uses better quality carbon to avoid spontaneous nucleation. As the temperature gradient method utilizes an initial graphite to diamond conversion step for the carbon source material, the quality of the graphite starting material is not so important. In contrast, the MPD process utilizes direct graphite to diamond conversion and thus a large quantity of graphite will remain in the capsule for a significant portion of long growth runs required for single crystal growth. Accordingly, very high quality graphite material is required to reduce the amount of spontaneous nucleation which may occur during the growth run. In practice, high quality graphite flakes are utilized and then subjected to an in-situ re-crystallization step to increase the quality of the material yet further prior to diamond growth.

Differences between the present MPD process and the pressure driven grit process can be summarized as follows:

(1) The MPD process uses inert seed pads to anchor the seeds in place therefore allowing better control of single crystal diamond morphology during growth. By inert we mean that the seeds are anchored to a holder which is chemically inert with respect to the diamond growth process, i.e. the seed pad holder is not made of graphite or metal catalyst but rather is made of a chemically inert material such as a chemically inert ceramic material (e.g. MgO, salt, alumina, alumina silicates, etc. . . . ). The holder should not decompose during the HPHT growth cycle such that the seeds remain anchored to the holder throughout the HPHT growth cycle to achieve controlled growth of large single crystal HPHT diamonds.

(2) The MPD process advantageously uses a lower carbon content chemistry to reduce spontaneous nucleation and increase the size of the pressure operating window in which an over-pressure can be applied without substantial spontaneous nucleation occurring. Lower carbon content can also reduce metal inclusions leading to better quality single crystal diamond product.

(3) The MPD process advantageously uses better quality carbon to avoid spontaneous nucleation over long reaction times and preferably includes an in-situ re-crystallization step prior to diamond growth.

(4) The MPD process requires more careful pressure control over longer time periods. The MPD process runs for much longer times and thus is more prone to spontaneous nucleation if not controlled by, e.g. better quality carbon, good control of pressure over long times, more metal solvent resulting in a larger operating window for application of an over-pressure without spontaneous nucleation.

(5) The MPD process uses a lower number of seeds. The seeded grit process uses a relatively large number of seeds when compared to the present MPD process. More seed surfaces distributed within the capsule can lower the chances of spontaneous nucleation occurring. Accordingly, the use of a lower number of seeds in the present MPD process when compared to the seeded grit process requires that pressure control is critical if attempting to grow larger single crystal diamond material.

In light of the above, features of the MPD process may be summarized as follows:

(1) Multiple inert seed pads with a plurality of seeds anchored to each pad to increase the volume of reactant mixture which is carbon depleted by the seeds during growth.

(2) Relatively uniform pressure and temperature conditions throughout the reaction capsule to ensure that all the seeds are exposed to substantially the same growth conditions to obtain substantially uniform product and control of pressure so as to remain above that required for diamond growth on seeds but below that which results in substantial spontaneous nucleation, i.e. use of a pressure driven rather than a temperature gradient driven growth process such that substantially the same growth conditions are provided throughout the reaction capsule.

Useful preferred features of the MPD process include:

(1) Optimized seed sizes and spatial distributions for a target size of single crystal HPHT synthetic diamond growth such that a majority, and preferably substantially all, of the reaction mixture volume is depleted of carbon by seed growth.

(2) Optimized reactants to inhibit spontaneous nucleation and promote high quality single crystal HPHT synthetic diamond growth including using highly crystalline/high purity graphite material, an intimate mixture of graphite and metal catalyst with a large graphite to metal catalyst contact area, and a relatively high ratio of metal catalyst to graphite.

(3) Optimizing pressure and temperature conditions during the diamond growth cycle to maintain diamond growth on the seeds while minimizing spontaneous nucleation. For example, gradually decreasing temperature during a growth run, while remaining in the temperature-pressure region required for diamond growth, aids in maintaining the required pressure for sustaining seed growth. Advantageously, this temperature decrease can be used in combination with pressure control to maintain an optimum overpressure for high quality diamond growth.

These preferred features make it easier to run at an over-pressure for a significant length of time and achieve good quality growth on the seeds over a long time period without significant quantities of spontaneous nucleation or metal inclusions.

However, accurate pressure control may reduce these requirements although the metal content may be important when low inclusion uptake is required in addition to its effect on the over-pressure window.

In the MPD process the diamond seed crystals tend to deplete carbon in their immediate vicinity thus reducing the level of carbon in solution at the diamond surfaces. Increasing the pressure in the capsule can sustain growth but with an accompanying increase in the risk of spontaneous nucleation. As the carbon depletion extends beyond the seed crystal so the length scale for carbon diffusion increases. In effect a diffusion layer or barrier layer is created around the diamond seed crystal. For growth of grit this is not so much of an issue as the seed crystals are finely dispersed, the duration of the process is relatively short and therefore the length scale for diffusion is small. The net result is that the overpressure should be kept at a level at which the risk of spontaneous nucleation is low.

Surprisingly, as described herein, the present inventors have found that large single crystal diamonds can be manufactured using the pressure driven process using a plurality of stacked seed pads. Furthermore, the present inventors have found that large crystals can be formed relatively quickly and with a relatively uniform size and morphology using such a technique. Further still, the present inventors have found that such a technique is simpler to implement and control when compared with very complex temperature gradient driven multi-layer arrangements or pressure driven processes in which only a single seed is provided on each seed pad.

While this invention has been particularly shown and described with reference to preferred embodiments, it will be understood to those skilled in the art that various changes in form and detail may be made without departing from the scope of the invention as defined by the appendant claims.

The invention claimed is:

1. A method for manufacturing a plurality of synthetic single crystal diamonds, the method comprising:
   forming a plurality of seed pads, each seed pad comprising a plurality of single crystal diamond seeds anchored to an inert holder;
   loading a carbon source, a metal catalyst, and the plurality of seed pads into a capsule, wherein the carbon source and the metal catalyst are mixed to form a reaction mixture comprising graphite in an amount in a range of from 16 to 35 wt. %, and at least a portion of the carbon source is located less than 0.1 mm from the single crystal diamond seeds;
   loading the capsule into a high pressure high temperature (HPHT) press; and
   subjecting the capsule to a HPHT growth cycle to grow single crystal diamond material on the plurality of single crystal diamond seeds, the HPHT growth cycle comprising:
   initiating HPHT growth of single crystal diamond material on the plurality of single crystal diamond seeds by increasing pressure and temperature;
   maintaining HPHT growth of single crystal diamond material on the plurality of single crystal diamond seeds via a pressure driven growth process by controlling and maintaining pressure and temperature for at least 20 hours; and
   terminating HPHT growth of single crystal diamond material on the plurality of single crystal diamond seeds by reducing pressure and temperature,
   wherein the plurality of single crystal diamond seeds remain anchored to the inert holders during the HPHT growth cycle, and
   wherein the inert holder comprises a ceramic material.

2. A method according to claim 1, wherein each seed pad comprises a number of single crystal diamond seeds in a range of from 8 to 3000 and/or wherein each seed pad comprises a density of single crystal diamond seeds in a range of from 0.3 to 45 seeds $cm^{-2}$.

3. A method according to claim 1, wherein the capsule comprises a number of seed pads in a range of from 4 to 30.

4. A method according to claim 1, wherein the seeds pads are spaced apart within the capsule such that a distance between the seeds pads is selected to be in a range of from 1 to 10-times a height of the single crystal diamond material after terminating HPHT growth and/or wherein the seeds pads are spaced apart within the capsule such that a distance between the seeds pads is selected to be in a range of from 1.0 to 12 mm.

5. A method according to claim 1, wherein the carbon source material has a total impurity level no more than 0.1%-by weight.

6. A method according to claim 1, wherein the carbon source material has a surface area per gram in a range of from 0.001 $m^2/g$ to 10 $m^2/g$.

7. A method according to claim 1, wherein the reaction mixture comprises powdered metal catalyst in an amount in the range of from 65% to 84% by weight prior to the HPHT growth cycle.

8. A method according to claim 1, wherein the initiating step comprises raising the pressure to a target starting value $P_s$ which is below the Berman-Simon graphite/diamond thermodynamic phase stability line, raising the temperature to a value $T_g$ which exceeds a eutectic temperature for the carbon source and the metal catalyst, holding the temperature and pressure for a time t, and then raising the pressure to a target starting value $P_g$ for the maintaining step to initiate HPHT growth.

9. A method according to claim 8, wherein the time t is in a range of from 1 to 36000 seconds.

10. A method according to claim 8, wherein the temperature $T_g$ is in a range of from 1070 Kelvin to 2470 Kelvin.

11. A method according to claim 8, wherein the pressure $P_s$ is within 0.01 to 2.0 GPa of pressure $P_g$.

12. A method according to claim 8, wherein the pressure $P_g$ is in a range of from 4.0 to 8.0 GPa.

13. A method according to claim 8, wherein the pressure is raised from $P_s$ to $P_g$ at a rate in a range of from 0.001 to 1.0 GPa per minute.

14. A method according to claim 1, wherein, during the maintaining step, a temperature difference between a top side and a bottom side of the capsule is maintained to be no more than 100 Kelvin.

15. A method according to claim 1, wherein, during the maintaining step, a temperature gradient between a top side and a bottom side of the capsule is maintained to be no more than 0.66 Kelvin $mm^{-1}$.

16. A method according to claim 1, wherein during the maintaining step the press moves anvils inwards whereby a volume of the capsule reduces by an amount in a range of from 0.5% to 50% and/or wherein during the maintaining step the press moves anvils inwards by a combined distance in the range of from 1 mm to 100 mm.

17. A method according to claim 1, wherein during the maintaining step the temperature is decreased in a continuous or stepwise manner while maintaining growth of single crystal diamond material on the plurality of single crystal diamond seeds.

18. A method according to claim 17, wherein the temperature is decreased at a rate in a range of from 0.1 Kelvin/hour to 2 Kelvin/hour.

19. An apparatus configured to perform the method according to claim 1, the apparatus comprising:
a capsule comprising a plurality of seed pads and reactants including a carbon source and a metal catalyst, wherein the reactants and seed pads are provided in alternating layers, and wherein each seed pad comprises a plurality of single crystal diamond seeds anchored to, or embedded in, an inert holder; and
a HPHT press comprising a heating circuit configured to maintain a substantially uniform temperature throughout the capsule whereby diamond growth on the single crystal seeds is achieved via a pressure driven growth process.

20. A method according to claim 1, wherein at least a portion of the carbon source is located less than 0.05 mm from the single crystal diamond seeds.

* * * * *